(12) United States Patent
Keller

(10) Patent No.: US 7,776,178 B2
(45) Date of Patent: Aug. 17, 2010

(54) SUSPENSION FOR SHOWERHEAD IN PROCESS CHAMBER

(75) Inventor: Ernst Keller, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 413 days.

(21) Appl. No.: 11/552,648

(22) Filed: Oct. 25, 2006

(65) Prior Publication Data

US 2008/0099146 A1    May 1, 2008

(51) Int. Cl.
  *H01L 21/306* (2006.01)
  *C23F 1/00* (2006.01)
  *C23C 16/00* (2006.01)
(52) U.S. Cl. .................. 156/345.34; 118/733
(58) Field of Classification Search ............ 156/345.34; 118/733
  See application file for complete search history.

(56) References Cited

U.S. PATENT DOCUMENTS

| | | | |
|---|---|---|---|
| 4,147,241 A * | 4/1979 | Preniczny et al. ....... 188/264 G |
| 4,854,263 A | 8/1989 | Chang et al. |
| 5,010,842 A | 4/1991 | Oda et al. |
| 5,310,453 A | 5/1994 | Fukasawa et al. |
| 5,350,480 A | 9/1994 | Gray |
| 5,439,524 A | 8/1995 | Cain |
| 5,449,410 A | 9/1995 | Chang et al. |
| 5,567,243 A | 10/1996 | Foster et al. |
| 5,569,356 A | 10/1996 | Lenz |
| 5,582,866 A | 12/1996 | White |
| 5,589,002 A | 12/1996 | Su |
| 5,595,606 A | 1/1997 | Fujikawa et al. |
| 5,614,026 A | 3/1997 | Williams |
| 5,628,829 A | 5/1997 | Foster et al. |
| 5,647,911 A | 7/1997 | Vanell et al. |
| 5,694,731 A * | 12/1997 | Tonsmann et al. ......... 52/656.3 |
| 5,844,205 A | 12/1998 | White |
| 5,846,332 A | 12/1998 | Zhao |
| 5,882,411 A | 3/1999 | Zhao |
| 5,968,276 A | 10/1999 | Lei |

(Continued)

FOREIGN PATENT DOCUMENTS

JP        63-187619 A       8/1988

(Continued)

OTHER PUBLICATIONS

U.S. Appl. No. 11/552,627, filed Oct. 25, 2006, Keller.

(Continued)

*Primary Examiner*—Michael Cleveland
*Assistant Examiner*—Nathan K Ford
(74) *Attorney, Agent, or Firm*—Robert J. Stern

(57) ABSTRACT

Stress within a suspension wall for suspending a showerhead in a process chamber is ameliorated by one or more of: (1) Openings in the suspension wall that reduce exposure of the suspension wall to process gas or ambient atmosphere when the chamber lid is opened. (2) A substantially vertical arrangement of one or more rifts in the suspension wall which facilitate horizontal buckling or flexing of the suspension wall. (3) A plurality of suspension walls whose respective central portions are coplanar. (4) A gas sealing skirt that helps protect the suspension wall from direct contact with process gas. The gas sealing skirt is connected to either the chamber wall or the showerhead but is not connected to both.

28 Claims, 14 Drawing Sheets

U.S. PATENT DOCUMENTS

| | | | |
|---|---|---|---|
| 5,989,652 A | 11/1999 | Ameen et al. | |
| 5,994,678 A | 11/1999 | Zhao | |
| 5,997,642 A | 12/1999 | Solayappan | |
| 5,997,649 A | 12/1999 | Hillman | |
| 5,997,962 A | 12/1999 | Ogasawara et al. | |
| 6,024,044 A | 2/2000 | Law et al. | |
| 6,024,799 A | 2/2000 | Chen et al. | |
| 6,050,216 A | 4/2000 | Szapucki | |
| 6,079,356 A | 6/2000 | Umotoy | |
| 6,093,645 A | 7/2000 | Ameen | |
| 6,106,625 A | 8/2000 | Koai et al. | |
| 6,114,216 A | 9/2000 | Yieh | |
| 6,123,775 A | 9/2000 | Hao | |
| 6,170,432 B1 | 1/2001 | Szapucki | |
| 6,183,563 B1 | 2/2001 | Choi | |
| 6,197,151 B1 | 3/2001 | Kaji | |
| 6,254,742 B1 | 7/2001 | Hanson et al. | |
| 6,302,057 B1 * | 10/2001 | Leusink et al. | 118/723 E |
| 6,336,845 B1 | 1/2002 | Engdahl | |
| 6,364,949 B1 | 4/2002 | Or et al. | |
| 6,394,026 B1 | 5/2002 | Wicker | |
| 6,416,385 B2 | 7/2002 | Ferri, Jr. | |
| 6,461,435 B1 | 10/2002 | Littau et al. | |
| 6,477,980 B1 | 11/2002 | White et al. | |
| 6,517,418 B2 | 2/2003 | Engdahl | |
| 6,527,908 B2 | 3/2003 | Kanetsuki et al. | |
| 6,772,827 B2 | 8/2004 | Keller et al. | |
| 6,823,589 B2 | 11/2004 | White et al. | |
| 6,827,815 B2 | 12/2004 | Hytros et al. | |
| 6,838,012 B2 | 1/2005 | Lenz | |
| 6,857,387 B1 | 2/2005 | Sun et al. | |
| 6,942,753 B2 | 9/2005 | Choi et al. | |
| 7,017,269 B2 | 3/2006 | White et al. | |
| 7,270,713 B2 | 9/2007 | Blonigan et al. | |
| 2001/0036792 A1 | 11/2001 | Ferri, Jr. | |
| 2001/0039168 A1 | 11/2001 | Engdahl | |
| 2002/0069968 A1 * | 6/2002 | Keller et al. | 156/345.33 |
| 2003/0098372 A1 | 5/2003 | Kim | |
| 2003/0132319 A1 | 7/2003 | Hytros | |
| 2004/0124281 A1 | 7/2004 | Leung | |
| 2005/0000432 A1 | 1/2005 | Keller et al. | |
| 2005/0173569 A1 | 8/2005 | Noorbakhsh | |
| 2005/0183827 A1 | 8/2005 | White et al. | |
| 2006/0060138 A1 | 3/2006 | Keller | |
| 2006/0263522 A1 * | 11/2006 | Byun | 427/248.1 |

FOREIGN PATENT DOCUMENTS

| | | |
|---|---|---|
| TW | 583902 B | 4/2004 |
| TW | I234817 | 6/2005 |

OTHER PUBLICATIONS

Search Report for Taiwan patent application No. 095128932, date of research May 27, 2008.

* cited by examiner

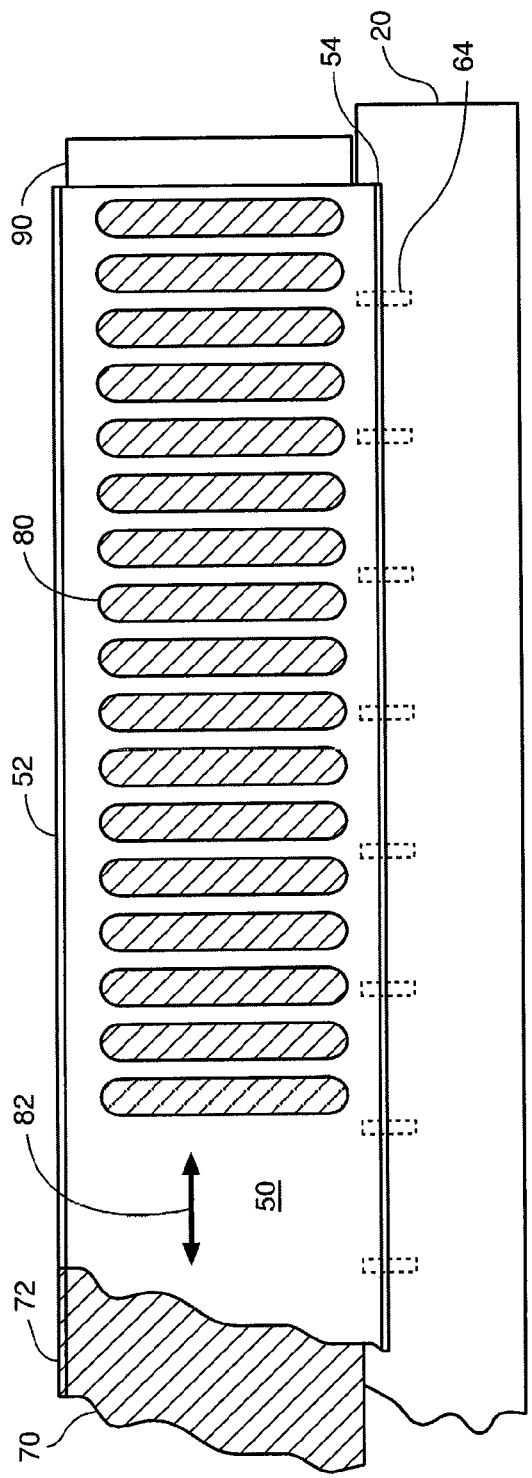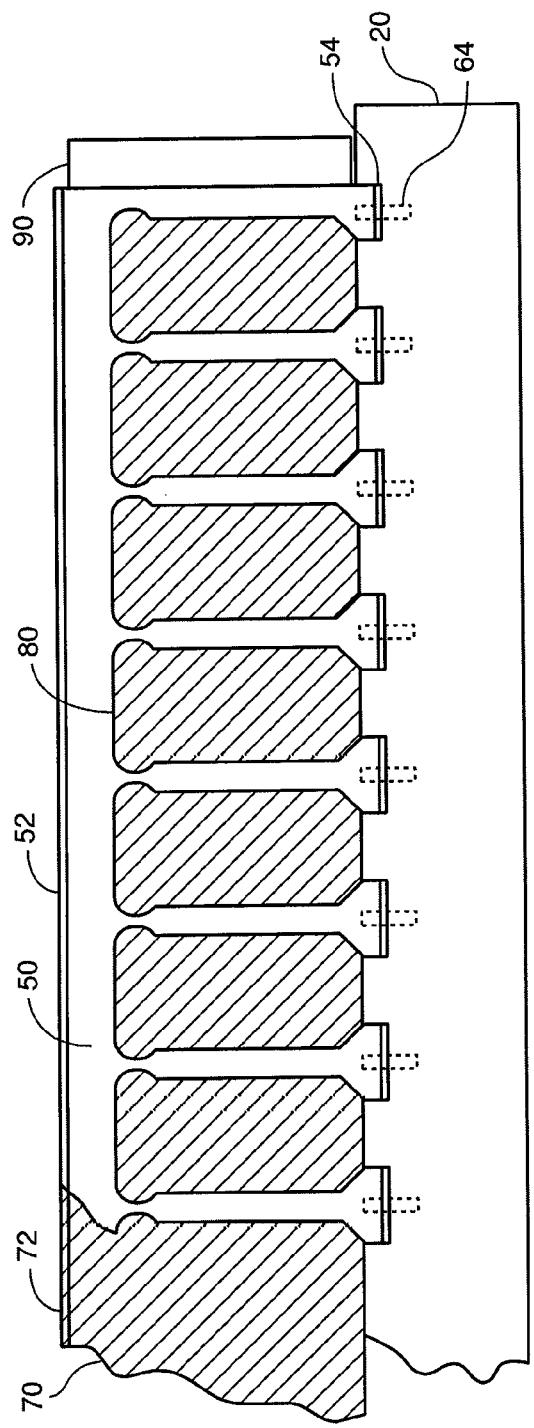
FIG. 9
FIG. 10

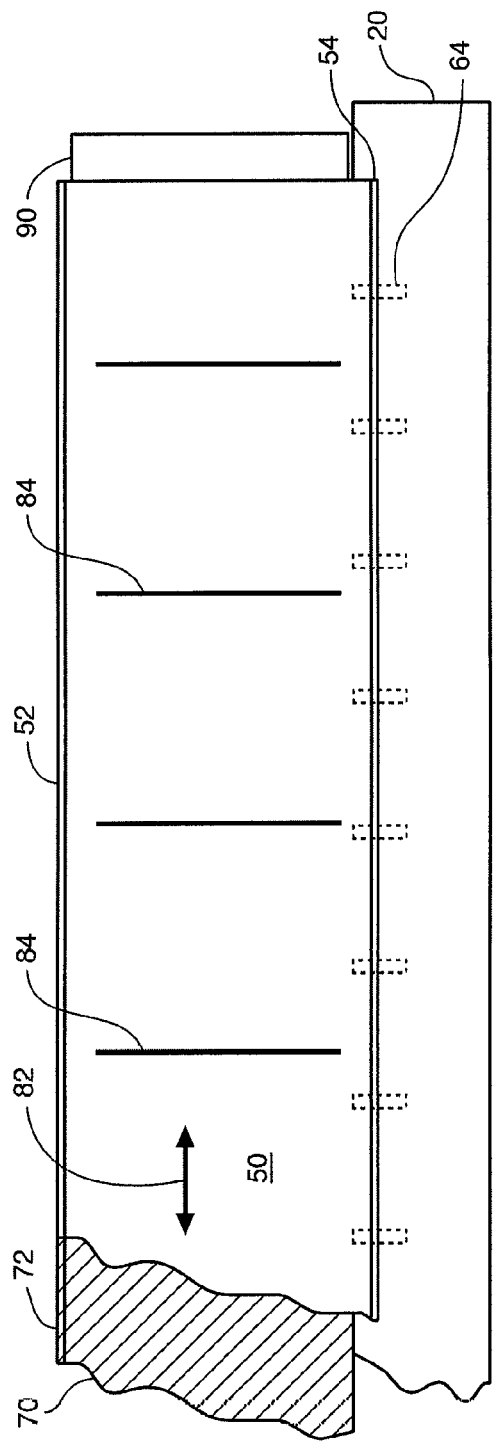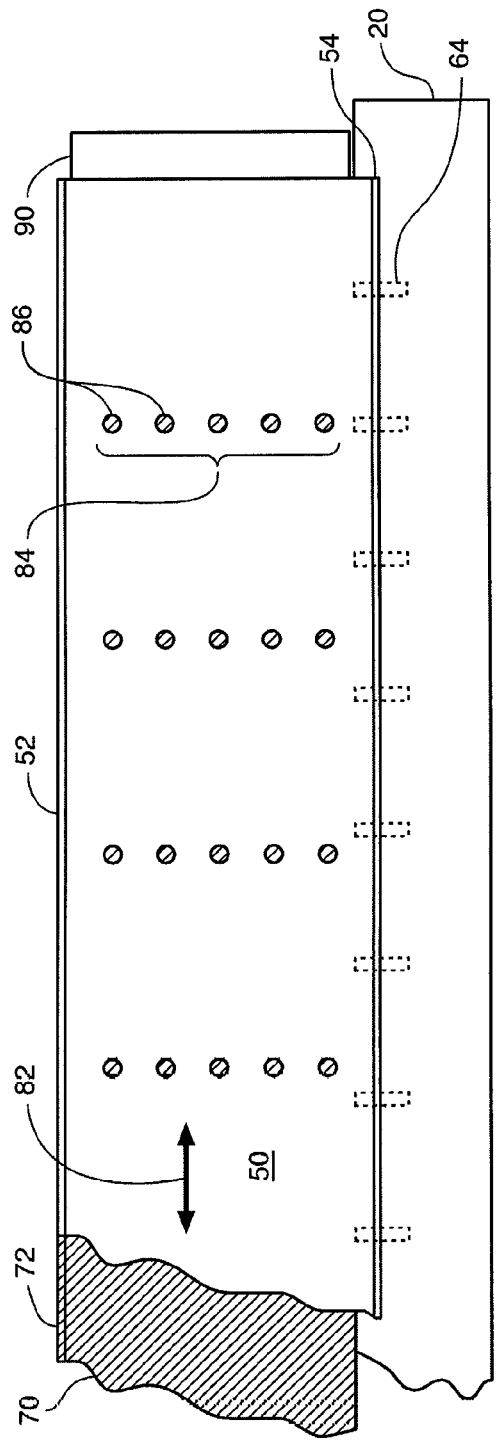

SUSPENSION FOR SHOWERHEAD IN PROCESS CHAMBER

FIELD OF THE INVENTION

The invention relates to apparatus and methods for suspending a showerhead for dispensing gas into a vacuum chamber used for manufacturing flat panel displays, semiconductors, and other electronic devices. More specifically, the invention relates to minimizing stress in such a suspension caused by thermal expansion and contraction of the suspension and the showerhead.

BACKGROUND OF THE INVENTION

Electronic devices, such as flat panel displays and integrated circuits, commonly are fabricated by a series of process steps in which layers are deposited on a substrate and the deposited material is etched into desired patterns. The process steps commonly include plasma-enhanced chemical vapor deposition (CVD) processes, thermal (non-plasma) CVD processes, and plasma-enhanced etch processes.

The substrate generally is mounted on a susceptor (alternatively called the chuck or workpiece support) within a vacuum chamber referred to as a process chamber. CVD and etch processes commonly require the substrate to be at an elevated temperature, in which case the susceptor is heated by some means such as resistive or radiant heating. In plasma processes, the plasma supplies additional heat to the substrate and the susceptor.

A process gas mixture commonly is dispensed into the process chamber through a gas distribution plate, commonly called a showerhead or showerhead, that is perforated with hundreds or thousands of orifices or passageways. The showerhead generally has a flat or slightly curved lower surface positioned close to and parallel with the upper surface of the substrate (and susceptor), and the gas passageways are distributed across the surface of the showerhead, so that the process gas dispensed through the showerhead is uniformly distributed over the area of the substrate (and susceptor).

In plasma processes, electrical or electromagnetic power is coupled to the process gas to excite it to a plasma state. The plasma decomposes the gas mixture into ion species that perform the desired deposition or etch process. In capacitively excited plasma chambers, the plasma is excited by RF power applied between the showerhead, which functions as an anode electrode, and the susceptor, which functions as a cathode electrode. An example of a showerhead in a plasma chamber is described in commonly-assigned U.S. Pat. No. 4,854,263 issued Aug. 8, 1989 to Chang et al.

It is desirable to maintain the showerhead at a high temperature comparable to that of the susceptor so that the showerhead does not cool off the susceptor. Older showerhead designs mounted the showerhead to the wall of the process chamber using relatively thick mounting flanges that kept the showerhead undesirably cool by conducting heat from the showerhead to the relatively cool wall of the process chamber. In contrast, commonly-assigned U.S. Pat. No. 6,477,980, issued Nov. 12, 2002 to White et al., and commonly-assigned U.S. Pat. No. 6,772,827, issued Aug. 10, 2004 to Keller et al., describe an improved showerhead suspension having thin suspension walls with high thermal impedance so that heat absorbed by the showerhead from the heated susceptor and the plasma is retained in the showerhead, thereby achieving a showerhead temperature comparable to that of the susceptor.

The aforesaid U.S. Pat. Nos. 6,477,980 and 6,772,827 further describe the suspension walls as being flexible to accommodate thermal expansion of the heated showerhead. For example, both patents describe a rectangular aluminum showerhead suspended by four suspension segments (suspension walls) respectively connected to the four sides of the showerhead, where each suspension wall is a rectangular aluminum sheet. Each sheet is thin enough to be flexible, so that it readily bends to accommodate thermal expansion of the showerhead in a direction approximately perpendicular to the surface of the sheet.

The aforesaid U.S. Pat. No. 6,772,827 (FIGS. 5-7 and 17) describes an additional improvement in which the each suspension wall is not rigidly attached to the showerhead, but is attached by means of pins projecting downward from the rim of the showerhead that engage with corresponding slots in a bottom flange of each suspension wall. The slots are larger than the pins so as to permit each suspension wall to slide relative to the showerhead in a horizontal direction parallel to the plane of the suspension wall, i.e., perpendicular to the direction in which the suspension wall flexes. As described in the patent, permitting such sliding is useful to accommodate rapid thermal contraction of the suspension when the chamber lid is opened to atmosphere, which causes the suspension to cool much more rapidly than the more massive showerhead.

However, Applicant has discovered that when the temperature of the showerhead and suspension bottom flange exceed about 220 degrees C., the stiction of the aluminum sometimes prevents the suspension walls from sliding relative to the showerhead. Therefore, if the chamber lid is opened when the suspension is hot, the suspension may experience thermal shock as the suspension rapidly cools and contracts while the bottom flange remains stuck to the showerhead.

Furthermore, even when the pins and slots successfully avert stress between the suspension and the showerhead, the pins and slots do not avert potentially damaging stress within the suspension wall due to rapid changes in the temperature differential between upper and lower portions of the suspension wall. Applicant has discovered that such rapid change in temperature differential commonly occurs when a hot suspension is suddenly cooled. Such rapid cooling can occur when a high temperature process step, such as a thermal CVD or plasma process step, is immediately followed by a low temperature step, such as a chamber purge step. Accordingly, there is a need for an improved design that reduces thermally induced stress in the suspension wall.

SUMMARY OF THE INVENTION

The invention includes various aspects that can be used separately or in combination to ameliorate thermally induced stress within the suspension wall.

One aspect of the invention is a suspension having one or more suspension walls, each of which includes one or more openings that collectively occupy at least five percent of the area of the suspension wall. The openings reduce thermal stress in the suspension by reducing the area of the suspension wall exposed to gas within the process chamber, thereby reducing the rate of heat transfer between the suspension and such gas.

The openings are especially advantageous to reduce stress (thermal shock) within the suspension wall when the chamber lid inadvertently is opened to expose the chamber interior to ambient atmosphere without first allowing the chamber components to cool down. The openings reduce the area of the suspension walls exposed to the cool air at ambient atmospheric pressure rushing into the chamber, thereby reducing the rate of cooling of the suspension wall.

A second aspect of the invention is a suspension having one or more suspension walls, each of which includes a substantially vertical arrangement of one or more rifts in the suspension wall. A substantially vertical arrangement of one or more rifts can be either a single rift that is substantially vertically elongated, or else a plurality of rifts of any shape that are spaced apart in a substantially vertical direction. For the purposes of this patent specification and claims, "substantially vertical" means within 45 degrees of vertical. A rift can be a slit, perforation or opening of any shape that extends entirely through the suspension wall. Alternatively, a rift can be a groove or notch that does not extend entirely through the suspension wall. Advantageously, the rifts can ameliorate stress in a suspension wall by weakening the wall at the location of the rifts, thereby facilitating horizontal flexing or buckling of the wall in response to thermal stress.

A third aspect of the invention comprises replacing at least one of the suspension walls with a plurality of suspension walls whose respective central portions are coplanar. Replacing one suspension wall with two, three or more coplanar suspension walls reduces the width of each suspension wall by approximately two, three or more, respectively, thereby correspondingly reducing the horizontal component of any thermally induced stress in each suspension wall.

A fourth aspect of the invention is a gas sealing skirt for enclosing the sides of the volume (i.e., the gas inlet plenum) through which process gas flows from the gas inlet in the chamber wall to the gas outlets in the showerhead. Because the gas sealing skirt performs this gas enclosure function, the suspension preferably can be positioned outside the volume enclosed by the gas sealing skirt so that the gas sealing skirt protects the suspension from exposure to the process gas.

More specifically, the gas sealing skirt is connected to either the chamber wall or the showerhead but is not connected to both. The upper or lower end of the gas sealing skirt that is not connected to either the chamber wall or the showerhead is separated from either the chamber wall or the showerhead by a number of gaps having a combined area no greater than one-third of the area of the outer surface of the gas sealing skirt. The number of gaps preferably is zero.

BRIEF DESCRIPTION OF THE DRAWINGS

FIG. 9 is a side view of one wall of a suspension having vertically extending elongated openings in accordance with a second aspect of the invention.

FIG. 10 is a side view of one wall of an alternative embodiment of the suspension whose openings extend all the way to the bottom edge of the suspension.

FIG. 12 is a side view of one wall of a suspension having one or more vertically elongated rifts in accordance with a third aspect of the invention.

FIG. 13 is a side view of one wall of an alternative embodiment in which the suspension has one or more vertical arrangement of rifts, wherein each vertical arrangement of rifts comprises a plurality of rifts spaced apart in a generally vertical direction.

DETAILED DESCRIPTION OF THE PREFERRED EMBODIMENTS

1. Process Chamber Overview

Figure 1:
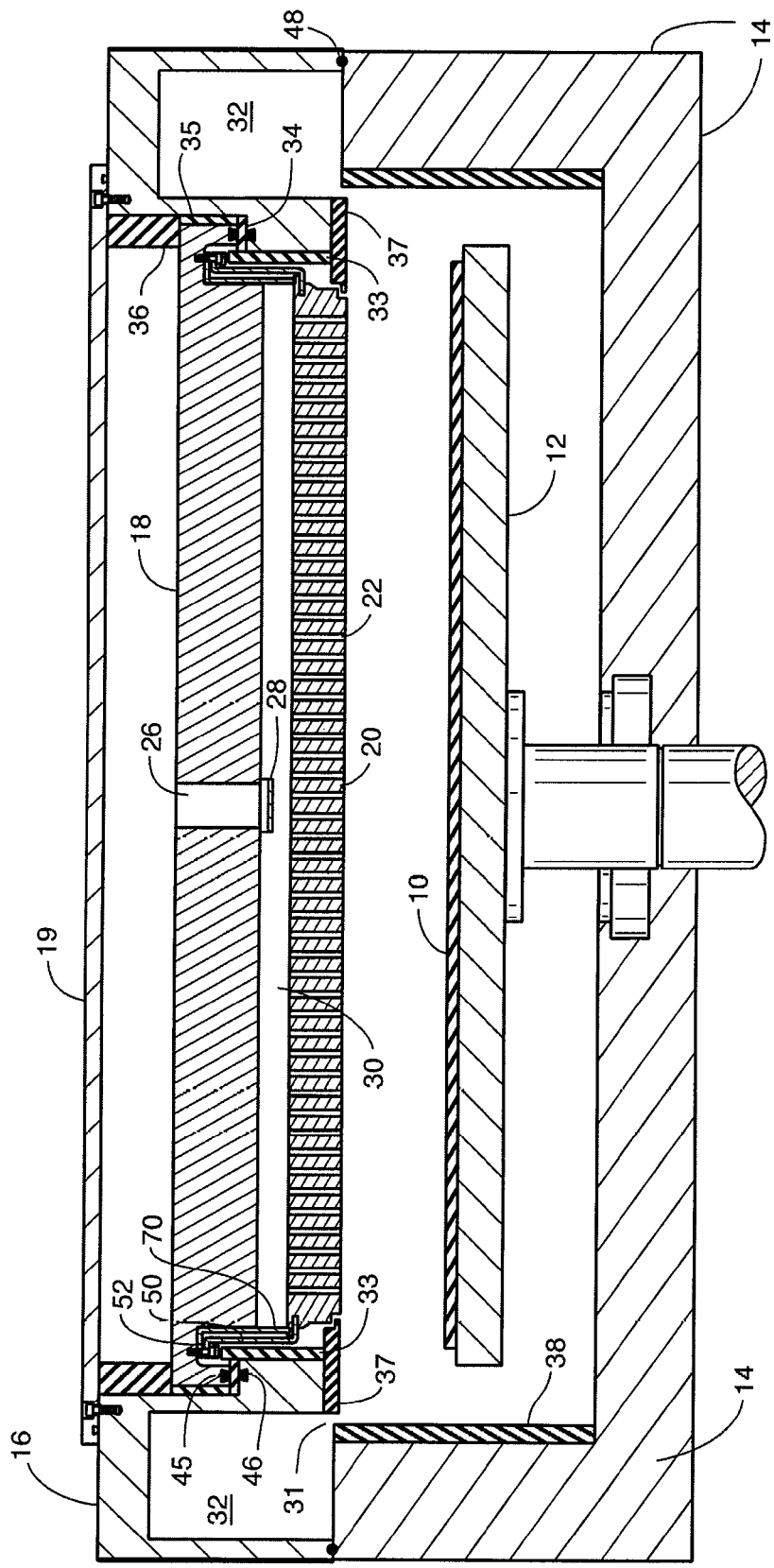
FIG. 1 is a sectional, partially schematic side view of a plasma chamber that includes the gas sealing skirt of the present invention.
Figure 2:
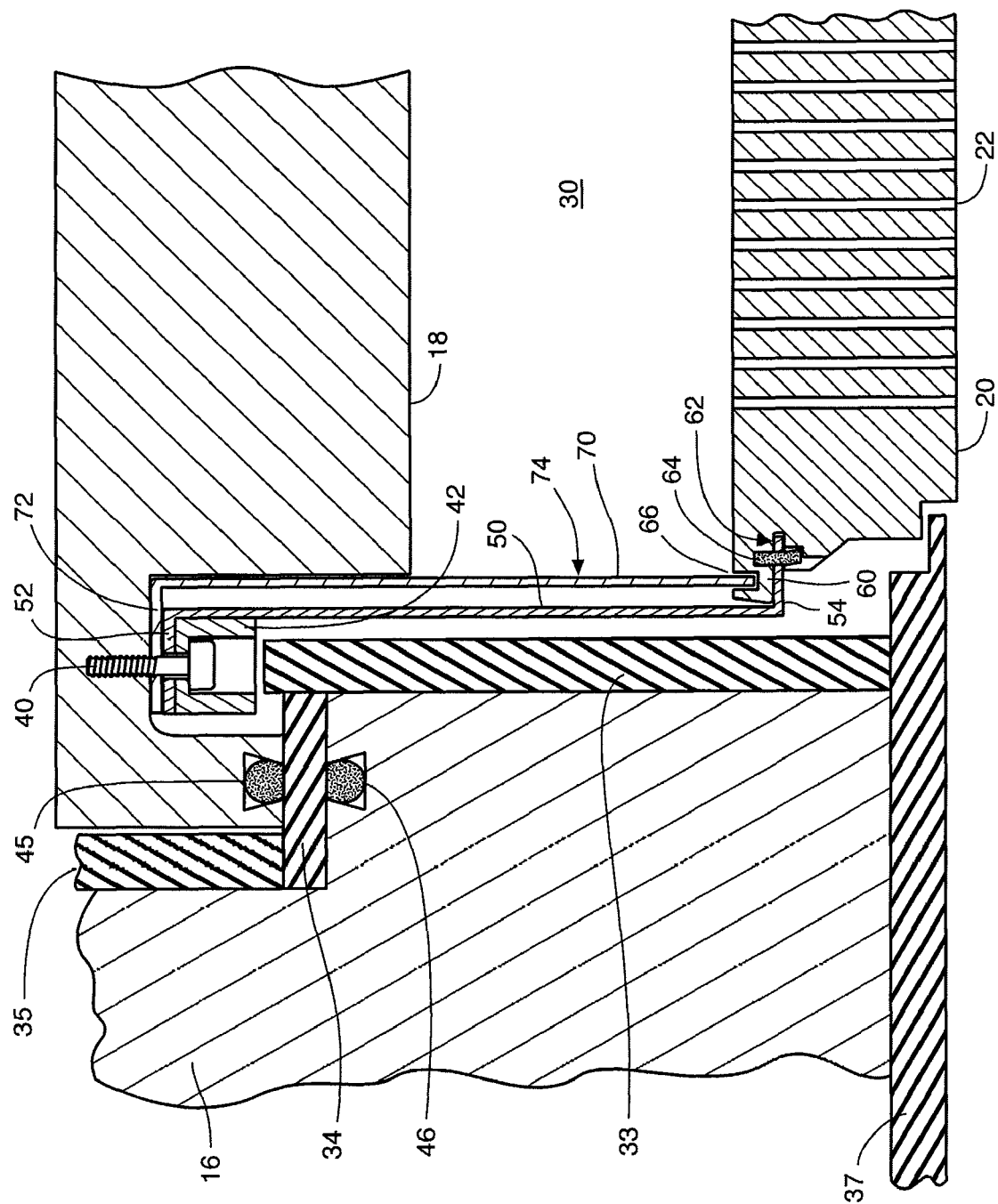
FIG. 2 is a vertical sectional view of the suspension, showerhead and gas sealing skirt.

FIGS. 1 and 2 show a process chamber that includes a suspended showerhead 20 and gas sealing skirt 70 according to the invention. Before describing the invention, the other components of the process chamber will be described.

The process chamber is a vacuum chamber intended to subject a workpiece or substrate 10 to a chemical process that is one step in a sequence of steps in the fabrication of electronic devices, such as flat panel displays or semiconductors, on the workpiece. The workpiece is supported within the chamber by a workpiece support 12, also called a chuck or susceptor. Common examples of a workpiece 10 that would be processed within the chamber include a rectangular glass substrate on which flat panel displays are fabricated or a circular semiconductor wafer on which integrated circuits are fabricated.

The process chamber has a housing or chamber wall 14, 16, 18 that provides a vacuum enclosure for the chamber interior. In the illustrated embodiment, the side and bottom walls of the chamber are implemented as a unitary wall 14. The top portion of the chamber wall is provided by a hinged lid 16 and a gas inlet manifold top wall 18. Personnel can access the interior of the chamber by raising or removing the lid 16. O-rings 45, 46, 48 (some not shown) provide vacuum seals between the chamber side and bottom wall 14, chamber lid 16, and gas inlet manifold top wall 18. The chamber side and bottom wall 14, the chamber lid 16, and gas inlet manifold top wall 18 are all considered portions of the chamber wall.

In performing a process for fabricating semiconductors or other electronic devices on the workpiece, one or more process gases are dispensed into the chamber through a gas inlet manifold. The gas inlet manifold includes the gas inlet manifold top wall 18, a showerhead 20 (also called a diffuser or gas distribution plate), and a gas inlet manifold side wall (defined three paragraphs below), all of which collectively enclose a volume, referred to herein as the gas inlet plenum 30, which constitutes the interior region of the gas inlet manifold.

At least one gas inlet passageway 26 is coupled between an external gas source (not shown) and the gas inlet plenum 30. In the FIG. 1 embodiment, the gas inlet passageway is an opening or tube extending through the gas inlet manifold top wall 18. The gas source supplies process gas to the gas inlet passageway 26, from which the gas flows into the pas inlet plenum 30, then flows from the gas inlet plenum into the interior of the chamber through gas outlet passageways 22 in the showerhead 20. Hundreds or thousands of gas outlet passageways 22 typically are uniformly distributed across the area of the showerhead.

A conventional vacuum pump, not shown, maintains a desired level of vacuum within the chamber and exhausts the process gas and reaction products from the chamber through an annular exhaust slit 31, then into annular exhaust plenum 32, and then through an exhaust channel, not shown, to the pump.

The gas inlet manifold side wall is defined as the one or more process chamber components that collectively provide a gas seal extending between the gas inlet manifold top wall 18 and the showerhead 20. In the preferred embodiment shown in FIG. 2, the novel gas sealing skirt 70 of the present invention (described below) functions as the gas inlet manifold side wall. In alternative embodiments that lack a gas sealing skirt, but otherwise can be identical, the suspension 50 functions as the gas inlet manifold side wall.

The gas inlet manifold side wall should provide a sufficiently gas-tight seal—that is, a sufficient impedance to gas leakage—so that most of the gas that flows into the gas inlet plenum 30 will enter the interior of the process chamber by flowing through the showerhead gas outlet passageways 22 rather than by leaking through gaps in the gas inlet manifold side wall. The amount of leakage that is acceptable depends on the process being performed on the workpiece, but in most processes the leakage should be less than ten percent. That is, less than ten percent (one-tenth) of the gas entering the gas inlet plenum through the gas inlet passageway 26 should leak through the gas inlet manifold side wall, so that at least ninety percent of the gas should be dispensed into the process chamber through the gas outlet passageways 22. At worst, no more than forty percent of the gas entering the gas inlet plenum should leak through the gas inlet manifold side wall.

The gas inlet manifold commonly includes a gas inlet deflector 28 that blocks gases from flowing in a straight path from the gas inlet passageway 26 to the directly adjacent gas outlet passageways 22 in the center of the showerhead, thereby helping to equalize the respective gas flow rates through the center and periphery of the showerhead. In the FIG. 1 embodiment, the gas inlet deflector 28 consists of a circular disc having a diameter slightly greater than that of the gas inlet passageway 26 and suspended below the gas inlet passageway by posts, not shown.

In the preferred embodiment, the showerhead 20 is an aluminum plate that is 3 cm thick. Preferably it should be thick enough so that it is not significantly deformed under atmospheric pressure when a vacuum is created within the chamber.

The showerhead 20 is suspended at its perimeter by a flexible suspension comprising one or more suspension walls 50. The flexibility of the suspension accommodates radial expansion and contraction of the showerhead as the temperature of the showerhead rises and falls. The suspension is described in more detail below, under the heading "2. Flexible Suspension for Showerhead", as well as in commonly-assigned U.S. Pat. No. 6,477,980 issued Nov. 12, 2002 to White et al., the entire content of which is hereby incorporated by reference into this patent specification.

Some types of workpiece fabrication process performed in a process chamber, such as thermal chemical vapor deposition (thermal CVD) processes, are performed in the absence of a plasma. Many other processes, such as plasma-enhanced chemical vapor deposition (PECVD) processes or plasma etch processes, do require a plasma. Process chambers intended for use in plasma processes are called plasma chambers.

In one type of plasma chamber, a plasma is generated or sustained within the chamber by capacitively coupling electrical power to the plasma by means of a radio frequency (RF) power supply (not shown) connected to electrodes within the chamber. In capacitively coupled plasma chambers, the showerhead 20 typically is composed of an electrically conductive material, preferably aluminum, so that it can function as an electrode. Consequently, it is important to provide electrical contact to the showerhead of sufficient conductivity and reliability to conduct high levels of radio frequency power, typically on the order of a kilowatt.

In some plasma chamber configurations, the showerhead 20 is connected directly to the electrically grounded chamber wall 14-18. However, the illustrated embodiments are a plasma chamber configuration in which the showerhead 20 is intended to be electrically connected to an ungrounded (RF hot) output of the RF power supply so that the showerhead functions as an anode electrode. The chamber side and bottom wall 14 and the chamber lid 16 are connected to electrical ground and therefore function as a cathode electrode. The susceptor or workpiece support 12 typically is electrically grounded also, but it optionally can be connected to a second RF power supply, commonly called the bias power supply. The present invention is useful irrespective of whether the showerhead is RF powered.

Because the gas inlet manifold top wall 18 and showerhead 20 are RF powered, dielectric liners 33, 34, 35, 36 are mounted between those RF powered components and the electrically grounded chamber lid 16. To concentrate the plasma in the region of the chamber between the workpiece support 12 and the showerhead 20, other metal surfaces in the chamber that are near the workpiece support or the showerhead commonly are covered with dielectric liners. For example, FIG. 1 shows a dielectric liner 37 covering the underside of the chamber lid 16 and a dielectric liner 38 covering the interior surface of the chamber side wall 14.

A cover 19 generally is attached to the top of the chamber lid 16 to protect personnel from accidental contact with the RF-powered top wall 18 or showerhead. The cover 19 will not be discussed further because the cover is unimportant to the functionality of the other chamber components discussed herein.

In a plasma chamber, the gas outlet passageways 22 in the showerhead should have a diameter smaller than the width of the plasma dark space in order to prevent plasma within the plasma chamber from entering the gas inlet plenum 30. The width of the dark space, and therefore the optimum diameter of the gas outlet passageways, depends on chamber pressure and other parameters of the specific semiconductor fabrication processes desired to be performed in the chamber. Alternatively, to perform plasma processes using reagent gases that are especially difficult to dissociate, it may be desirable to employ passageways having a narrow inlet and a wider, flared outlet as described in the above-referenced U.S. Pat. No. 4,854,263 to Chang et al., the entire disclosure of which is hereby incorporated in this patent specification.

The chamber components should be composed of materials that will not contaminate the semiconductor fabrication processes to be performed in the chamber and that will resist corrosion by the process gases. Aluminum is our preferred material for all of the components within the chamber other than the O-rings and the dielectric liners 33-36.

The design and operation of conventional CVD and etch chambers are described in the following commonly-assigned U.S. patents, the entire content of each of which is hereby incorporated by reference in this patent specification: U.S. Pat. No. 5,844,205 issued Dec. 1, 1998 to White et al.; and U.S. Pat. No. 4,854,263 issued Aug. 8, 1989 to Chang et al.

2. Flexible Suspension for Showerhead

Figure 3:
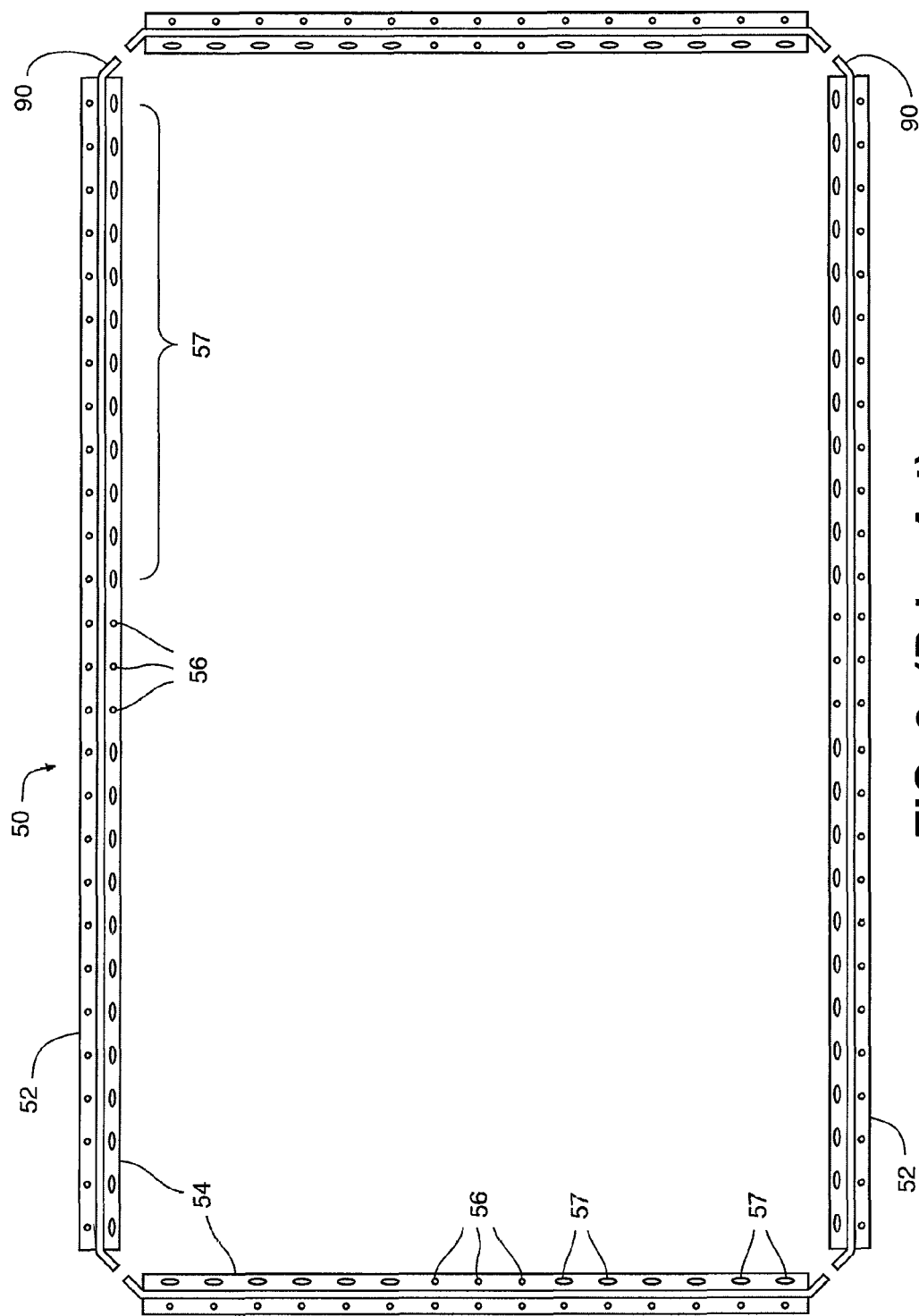
FIG. 3 is a plan view of a suspension showing features that the preferred embodiment of the invention shares with a prior art design.

FIGS. 2 and 3 show the suspension in more detail. The showerhead 20 is suspended by a flexible suspension comprising one or more flexible suspension walls 50. The flexibility of the suspension accommodates radial expansion and contraction of the showerhead as the temperature of the showerhead rises and falls.

The amount by which the showerhead 20 expands is proportional to both the temperature of the showerhead and its width. Because of the latter, accommodating thermal expansion of the showerhead without mechanical stress is especially important with the larger showerheads required to process larger workpieces, such as large flat panel displays. To minimize heat transfer from the workpiece and susceptor to the showerhead, it is desirable to maintain the showerhead at 350 to 400 degrees C. while performing a CVD process in the chamber. At such high temperatures, an aluminum showerhead expands by about one percent (1%) in each dimension. For example, the width of a 105 cm×125 cm showerhead expands by about 12 mm. Relative to a fixed reference point in the center of the showerhead, each edge of the showerhead expands outward by half this amount (0.5%).

When the width of the showerhead 20 expands in response to its temperature increase during normal operation of the chamber, it pushes the flexible suspension walls 50 to bend outward (i.e., in a direction along the radius of the showerhead, which is roughly perpendicular to the plane of the suspension) by the amount of the showerhead expansion.

To support the weight of the showerhead, the upper portion of the flexible suspension 50 is directly or indirectly connected to the chamber wall 14-18, and the lower portion of the suspension is directly or indirectly connected to the showerhead 20. By "indirectly connected", we mean that intermediate components such as dielectric liners or mounting flanges may be connected between the upper portion of the suspension and the chamber wall. Likewise, such intermediate components may be connected between the lower portion of the suspension and the showerhead.

Throughout this patent specification, when two components are described as being connected, unless specified otherwise they may be connected directly or indirectly, and they may be fabricated as a unitary piece of material rather than as two separate pieces that are attached together. For example, the suspension 50 and the showerhead 20 can be machined from a unitary block of aluminum.

The illustrated embodiments are intended for processing a large rectangular glass substrate or workpiece 10 on which flat panel displays are to be fabricated. The workpiece support or susceptor 12, the gas inlet manifold top wall 18, and the showerhead 20 are rectangular in cross section. The suspension comprises four suspension walls 50 respectively connected to the four sides of the showerhead. Each of the four suspension walls is an aluminum sheet with a planar central portion extending between the gas inlet manifold top wall 18 and the showerhead. The planar central portion is thin enough to be flexible so that it can bend in response to thermal expansion and contraction of the showerhead. Each of the four sheets 50 is bent at a right angle near its upper end to form an upper flange 52 and is bent at a right angle near its lower end to form a lower flange 54, as shown in FIG. 3.

The upper flange 52 of each suspension wall 50 is attached by bolts 40 to the gas inlet manifold top wall 18. Preferably, the attachment of each upper flange 52 to the gas inlet manifold top wall is reinforced by an aluminum bar 42, having a U-shaped cross section, that extends the entire width of each upper flange 52 and that is positioned between the bolt heads and the upper flange. The illustrated embodiments include four reinforcing bars 42, one for each upper flange 52.

The lower flange 54 of each suspension wall is slideably mounted within a groove 62 in the rim 60 of the showerhead. To prevent the lower flanges 54 from slipping out of the grooves 62, each lower flange has a plurality of mounting holes 56, 57, and each mounting hole engages a corresponding pin 64 extending downward from the rim of the showerhead. As shown in FIG. 2, the rim of the showerhead includes a cutout adjacent each pin to provide room to insert the pin. After insertion, the lower end of each pin can be bent inward so that it is wedged above a small outward projection of the showerhead rim that prevents the pin from falling down.

As shown in FIG. 3, a small number of mounting holes 56 near the center of each lower flange 54 are circular with a diameter only slightly larger than that of the pins, thereby maintaining alignment between the center of the showerhead and the center of the suspension wall 50. The remaining mounting holes 57 are elongated in a direction parallel to the long dimension of the lower flange so as to permit relative thermal expansion and contraction between the showerhead and the lower flange along such direction, i.e., along a horizontal direction parallel to the rim of the showerhead and perpendicular to the plane of the central portion of the suspension wall.

Figure 15:
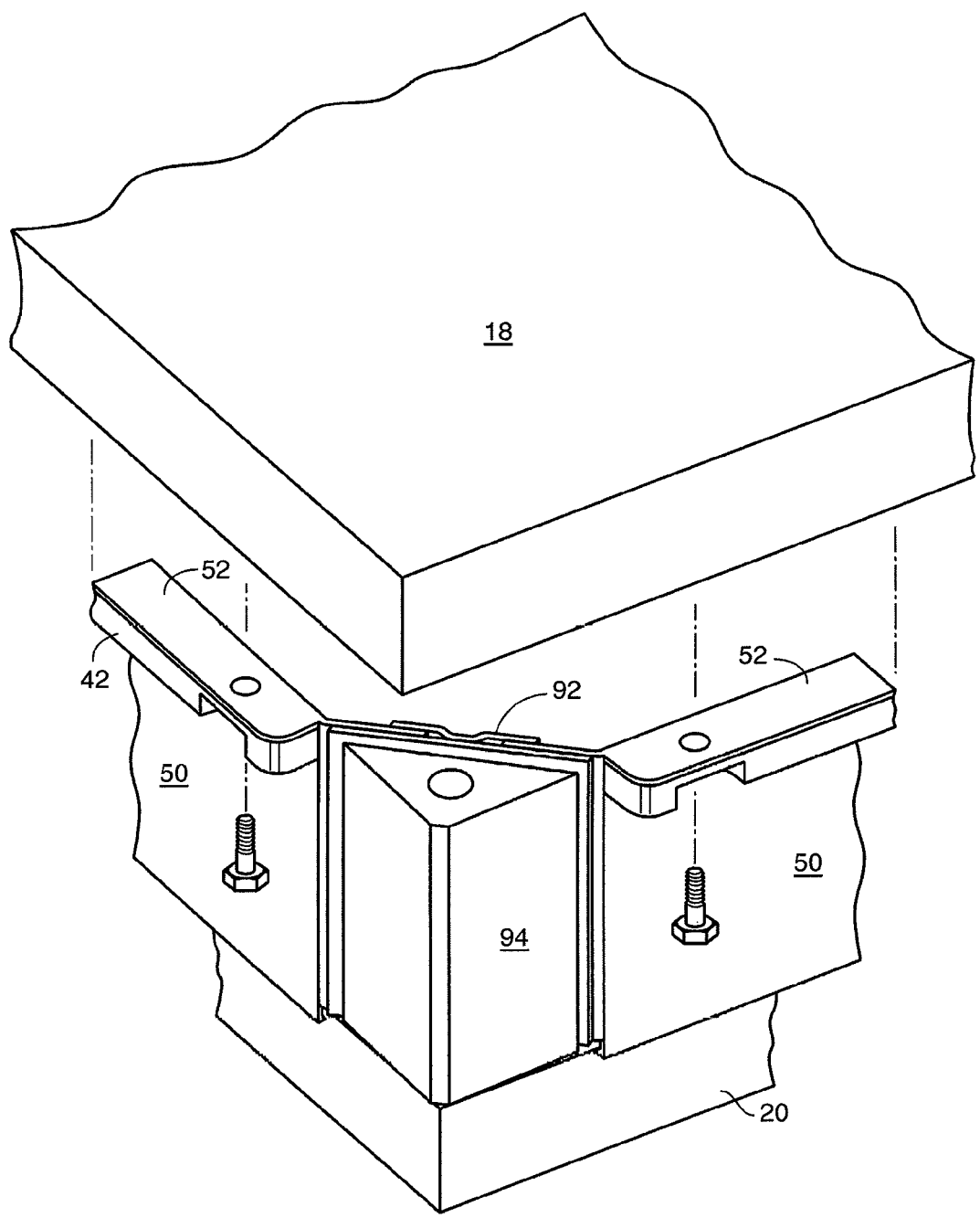
FIGS. 15 and 16 are perspective and exploded views, respectively, of the corner junction of a prior art suspension design.
Figure 16:
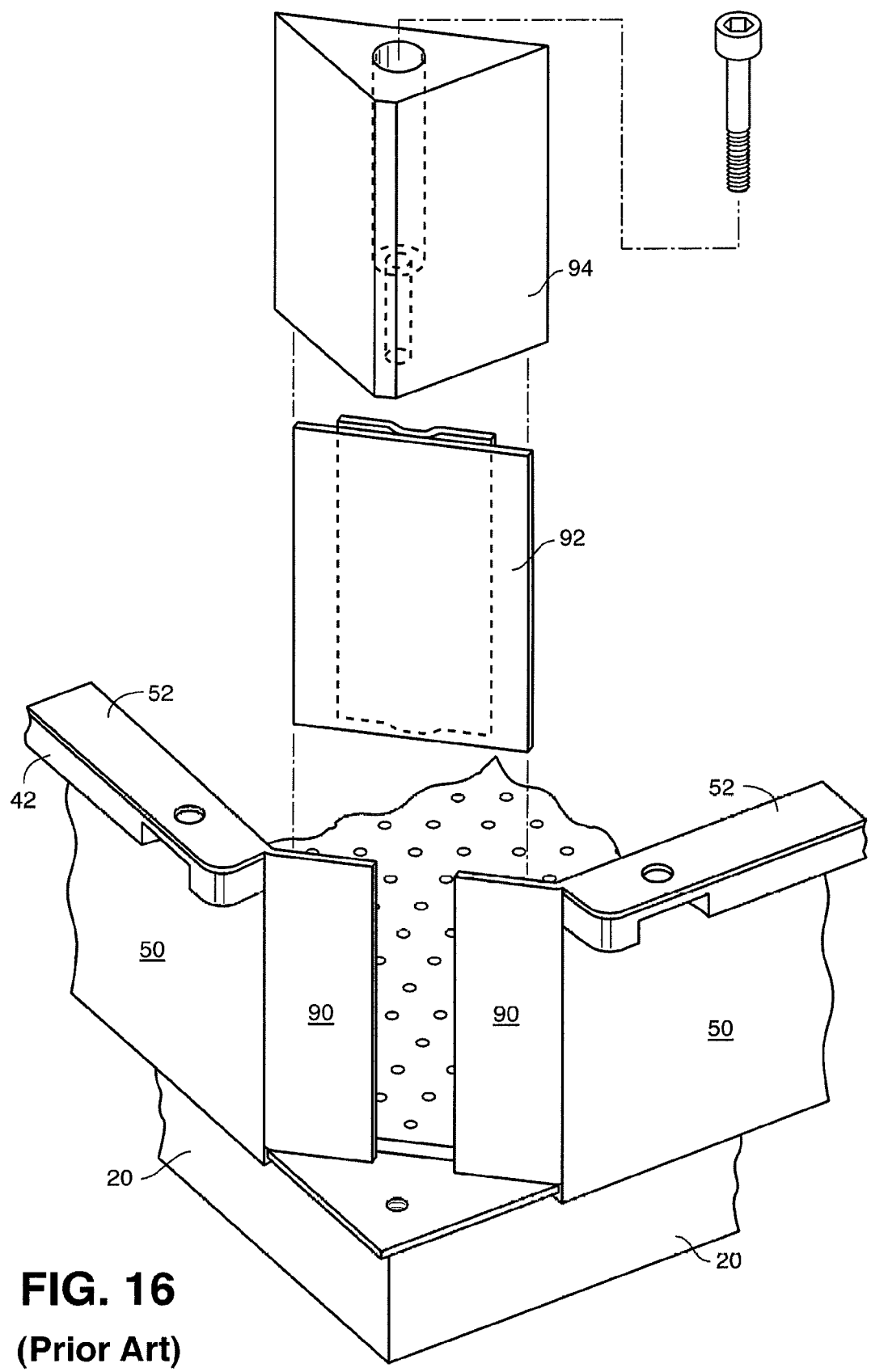

FIGS. 3, 15 and 16 show that the two lateral extensions 90 of each of the four suspension walls 50 are oriented at a 45-degree angle relative to the plane of the central portion of the suspension wall 50. Consequently, at each of the four corners of the suspension, the two lateral extensions 90 at that corner are coplanar. Preferably, each suspension wall 50 is a single piece of sheet aluminum or other metal, and the lateral extensions preferably are formed by bending the lateral extensions of the sheet at a 45-degree angle.

To inhibit leakage of process gas from the gas inlet plenum 30 through each corner of the suspension, each corner preferably also includes a slotted coupler 92, formed in the shape of two back-to-back U's, that is positioned so as to overlap the adjacent ends of the two lateral extensions 90 at that corner and so as to bridge the gap between the two lateral extensions. The coupler 92 can be fabricated by welding together two pieces of sheet aluminum along a vertical center seam and bending one coupler piece so as to create a slot between it and the other coupler piece. The resulting corner seal 90, 92 can slide radially inward and outward as the showerhead and suspension expand and contract. To further inhibit leakage of process gas from the gas inlet plenum 30 through each corner of the suspension, each corner preferably further includes a corner post 94 that is connected to the corresponding corner of either the gas inlet manifold top wall 18 or the showerhead 20, as shown in FIGS. 15 and 16. The corner post is positioned close enough to the corner seal 90, 92 to inhibit gas leakage through the corner seal, but far enough radially outward of the corner seal to permit the suspension to expand outward in response to the elevated temperatures to which it will be subjected during operation of the process chamber.

All aspects of the flexible suspension described above are described in commonly-assigned U.S. Pat. No. 6,772,827 issued Aug. 10, 2004 to Keller et al., the entire disclosure of which is hereby incorporated in this patent specification.

Figure 4:
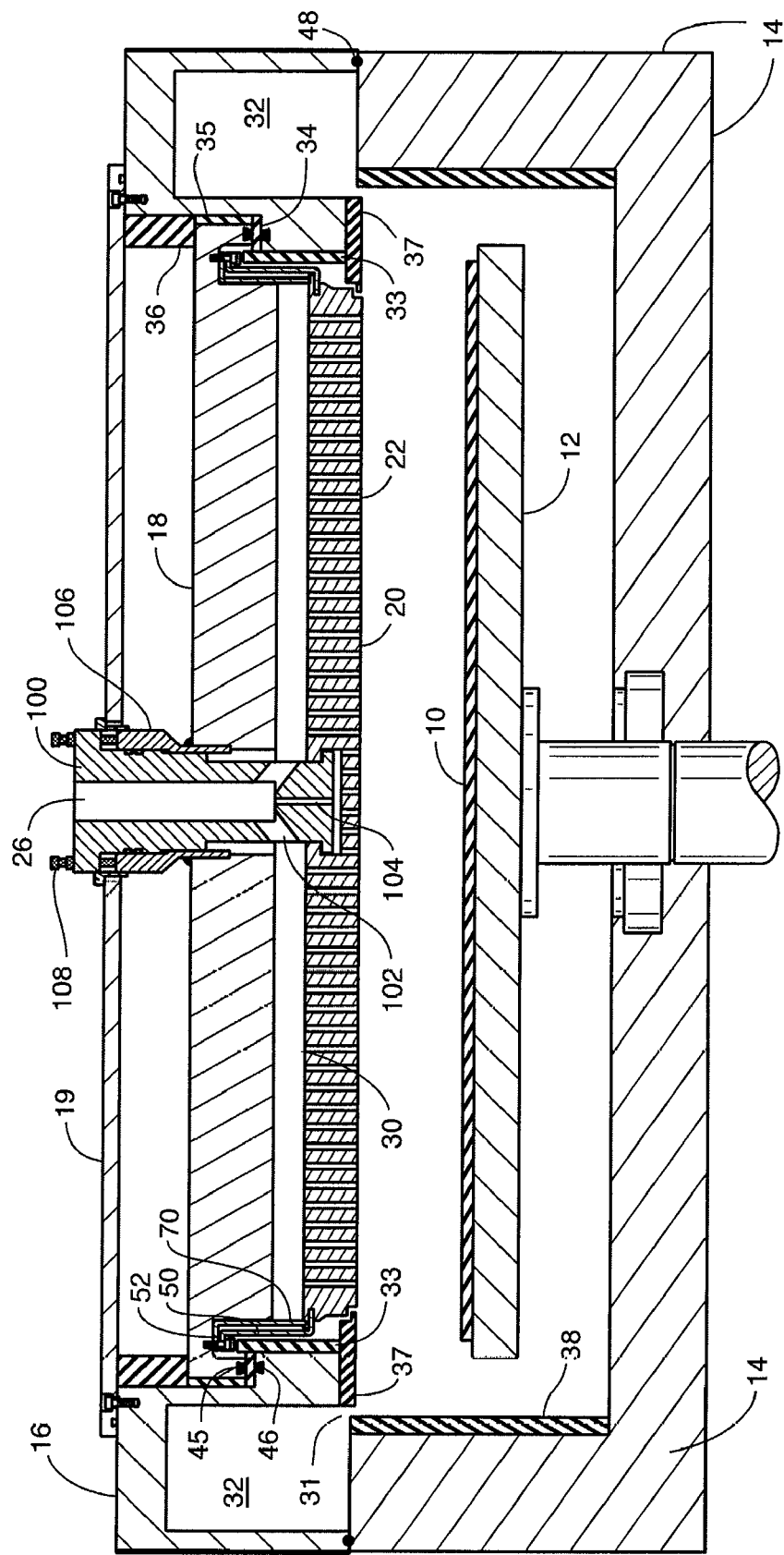
FIG. 4 is a sectional, partially schematic side view of a plasma chamber like that of FIG. 1, further including a center support for the showerhead.
Figure 5:
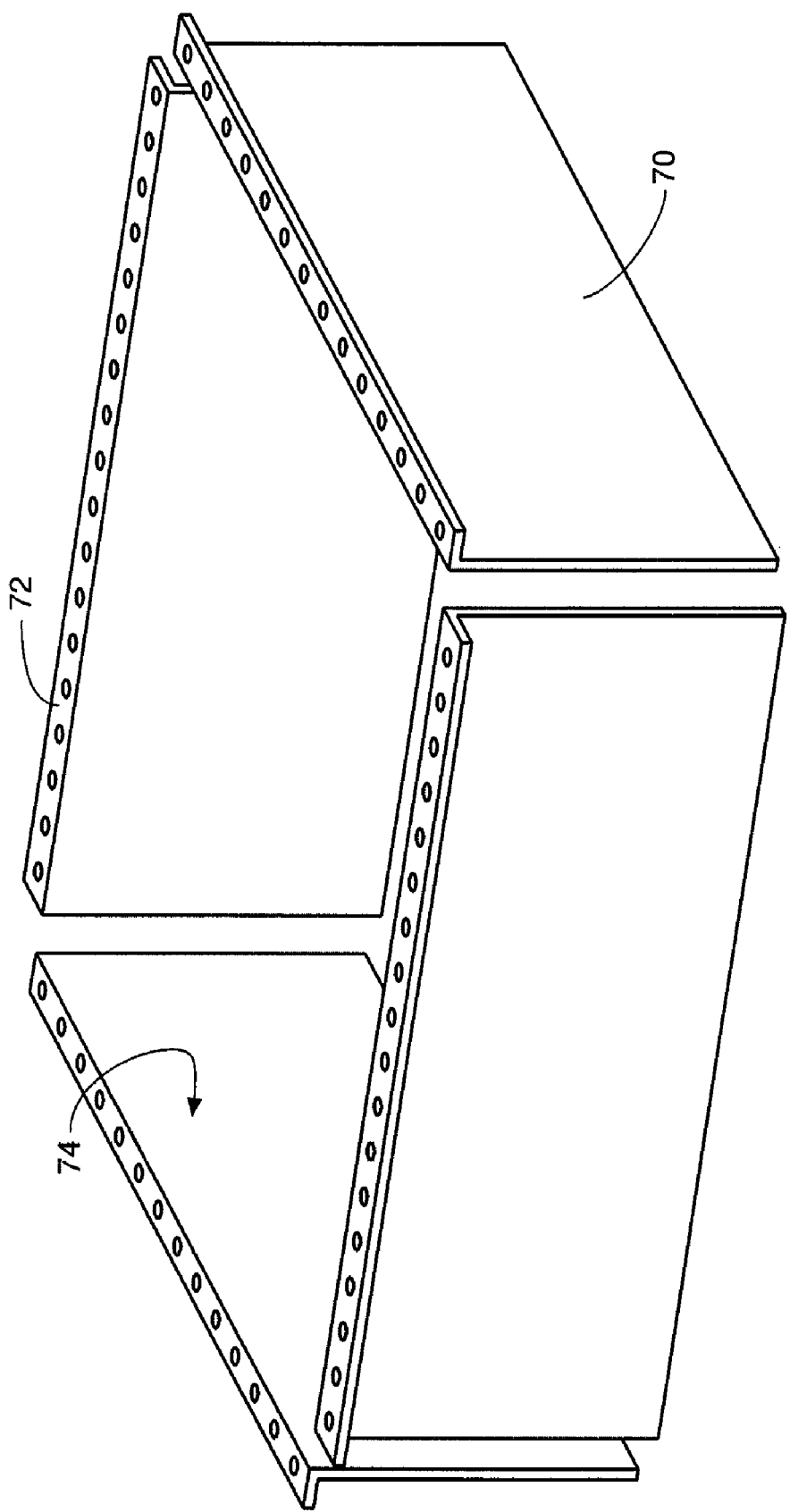
FIG. 5 is a perspective view of the gas sealing skirt of FIGS. 1, 2 and 4.

The flexible suspension 50 supports the entire weight of the showerhead 20 in the embodiment of FIG. 1 described above. Because this embodiment of the suspension supports the showerhead only adjacent its perimeter, the center of the showerhead can sag over a period of time. To prevent the center from sagging, it is preferable to add to the suspension a showerhead center support 100-108 as shown in FIG. 4.

The showerhead center support 100-108 has a tubular gas conduit 100 that extends through a central opening in the gas inlet manifold top wall 18. The showerhead 20 has a cavity at the center of its upper surface that extends about two-thirds of the depth of the showerhead. The lower end of the gas conduit extends into this cavity and mechanically supports the center of the showerhead by means of flanges extending radially outward from the lower end of the gas conduit so as to abut the underside of complementary flanges of the showerhead that extend radially inward above the cavity opening. Accordingly, the center support 100-108 supports a portion of the weight of the showerhead, and the flexible suspension 50 supports the remainder of the weight.

A plurality of radially extending gas passageways 102 couple the interior of the gas conduit 100 to the gas inlet plenum 30. One or more downward extending passageways 104 couple the interior of the gas conduit to a cavity or plenum between the bottom of the gas conduit and the upper end of the showerhead gas passageways 22 underlying the cavity. Consequently, the interior of the gas conduit 100 and the gas passageways 102, 104 in combination function as the gas inlet passageway 26.

The upper end of the gas conduit 100 is mounted to and mechanically supported by the chamber cover 19 by means of a mounting ring 106 and jack screws 108 that enable the height of the gas conduit to be adjusted. Raising the gas conduit raises the center of the showerhead 102. Therefore, the height of the gas conduit can be adjusted to prevent the center of the showerhead from sagging or to achieve a desired contour for the showerhead. The mounting ring 106 surrounds the portion of the gas conduit 100 that extends through the chamber cover. The mounting ring 106 is rigidly attached to the chamber cover, preferably by bolts. The upper end of the gas conduit is attached to the upper end of the mounting ring by means of a plurality of jack screws so that the height of the gas conduit can be adjusted by rotating the screws. Specifically, the upper end of the gas conduit has an outward-extending flange with a plurality of threaded holes to receive the jack screws. The lower end of each screw extends into a threaded hole in the mounting ring. (A jack screw is an ordinary screw; the term "jack" merely describes its function.)

Such a center support is described in more detail in commonly-assigned U.S. patent application Ser. No. 11/188,922 filed Jul. 25, 2005 by Ernst Keller, the entire content of which is hereby incorporated by reference into this patent specification.

All aspects of the present invention described below are useful in both the embodiment of FIG. 4 having a showerhead center support and the embodiment of FIG. 1 without such center support.

3. Problem of Suspension Stress During Cooling

To minimize stress between the suspension 50 and the showerhead 20 caused by differential thermal expansion, the suspension and the showerhead preferably are composed of the same material, preferably aluminum, so that they expand and contract by the same amount in response to temperature changes. In addition, the previously described method of slideably attaching the lower flange 54 of each suspension wall to the showerhead by means of pins 64 engaged with elongated holes 57 permits a certain amount of relative motion between the suspension walls and the showerhead to accommodate differential thermal expansion that may be caused by temperature differences between the suspension walls and the showerhead.

However, as stated in the Background of the Invention, rapid changes in the temperature gradient within the suspension wall can cause stress within the suspension wall that eventually can deform, crack or tear the suspension. In practice, such rapid changes in the temperature gradient commonly result from rapid cooling of the suspension wall when performing a process sequence in which a high temperature process step, such as a thermal CVD or plasma process step, is immediately followed by a low temperature step, such as a chamber purge step. Also, rapid cooling can occur if the chamber lid 16 inadvertently is opened to expose the suspension walls 50 to the ambient atmosphere without first allowing the chamber components, especially the showerhead, to cool down to the ambient room temperature.

When such rapid cooling occurs, the suspension walls 50 typically cool much faster than the showerhead 20 because the suspension walls preferably are much thinner than the showerhead and hence have a much lower thermal mass. The suspension walls are intended to be thin enough to be extremely flexible so that they can bend outward to accommodate thermal expansion of the showerhead. In contrast, the showerhead should be thick enough to avoid distortion of the contour of the lower surface of the showerhead in response to temperature gradients, because any such distortion will cause spatial non-uniformity in the process being performed on the workpiece. For example, in the preferred embodiment the suspension walls are aluminum sheets having a thickness of 1 mm, whereas the aluminum showerhead has a thickness of 30 mm.

When cool gas is supplied to the gas inlet plenum 30, the suspension walls 50 will cool much more rapidly than the showerhead 20 because the suspension walls have much lower thermal mass. In addition, because the showerhead cools more slowly and has a much higher thermal mass, the showerhead will transfer heat to the lower portion of each suspension wall so as to prevent the lower portion from cooling as rapidly as the upper portion. The resulting temperature gradient between the cool upper portion and hot lower portion of each suspension wall 50 produces mechanical stress in each suspension wall because the upper portion will contract faster than the lower portion as it cools off more rapidly. Such mechanical stress caused by temperature gradients is commonly referred to as thermal stress or thermal shock.

The present invention offers four solutions, useful independently or in combination, for reducing thermal stress in the suspension walls: (1) A gas sealing skirt that helps protect the suspension wall from direct contact with process gas. (2) Openings in the suspension wall that reduce exposure of the suspension wall to process gas or ambient atmosphere when the chamber lid is opened. (3) A substantially vertical arrangement of one or more rifts in the suspension wall which facilitate horizontal buckling or flexing of the suspension wall. (4) A plurality of suspension walls whose respective central portions are coplanar.

4. Gas Sealing Skirt

One aspect of the invention is a gas sealing skirt 70, shown in FIGS. 1, 2, 4 and 5, for enclosing the sides of the volume (i.e., the gas inlet plenum 30) through which process gas flows from the gas inlet 26 in the chamber wall to the gas outlets 22 in the showerhead 20.

In the prior art suspended showerheads described in the Background of the Invention, the sides of the gas inlet plenum are enclosed by the suspension walls. In the present invention, this gas enclosure function is performed by the gas sealing skirt 70 rather than the suspension walls. Consequently, the invention enables positioning the suspension walls 50 preferably outside the volume (i.e., the gas inlet plenum 30) enclosed by the gas sealing skirt, so that the gas sealing skirt is interposed between the gas inlet plenum 30 and the suspension walls 50, as in the preferred embodiment shown in FIGS. 1, 2, 4 and 5. In this preferred embodiment, the gas sealing skirt protects the suspension walls from direct contact with process gas entering the chamber, thereby reducing the cooling rate and temperature gradients within the suspension when a cool process gas is supplied suddenly after performing a hot process in the chamber.

In the alternative embodiment of FIG. 4, the flexible suspension walls 50 remain outside the gas inlet plenum 30, but the suspension further includes a showerhead center support 100 that is inside the gas inlet plenum. That is, the center support 100 is not protected by the gas sealing skirt 70 from contact with the process gas.

Returning now to a general description of the invention rather the illustrated embodiments, the gas sealing skirt 70 extends between an upper portion that is adjacent the chamber wall 14-18 and a lower portion that is adjacent the showerhead 20. As explained in the following three paragraphs, "adjacent" means "connected to", "abutting", or "separated from by one or more of the gaps defined in the following paragraphs".

The gas sealing skirt 70 is connected to either the chamber wall or the showerhead but is not connected to both. That is, either the upper end of the gas sealing skirt is connected to the chamber wall or else the lower end of the gas sealing skirt is connected to the showerhead, but not both. Therefore, unlike the suspension 50, which is connected to both the chamber wall and the showerhead, the gas sealing skirt does not support the weight of the showerhead, and the skirt has more freedom to expand or contract without being constrained by the distance between the showerhead and the chamber wall. The upper or lower end of the gas sealing skirt that is not connected to either the chamber wall or the showerhead is referred to as the "unconnected" end of the gas sealing skirt.

To clarify the terminology used in the preceding paragraph, if the upper end of the gas sealing skirt 70 is connected to the chamber wall 14-18, then the lower end of the gas sealing skirt is the "unconnected end" of the gas sealing skirt, and "said one component" is the showerhead 20. Conversely, if the lower end of the gas sealing skirt is connected to the showerhead, then the upper end of the gas sealing skirt is the "unconnected end" of the gas sealing skirt, and "said one component" is the chamber wall.

Figure 6:
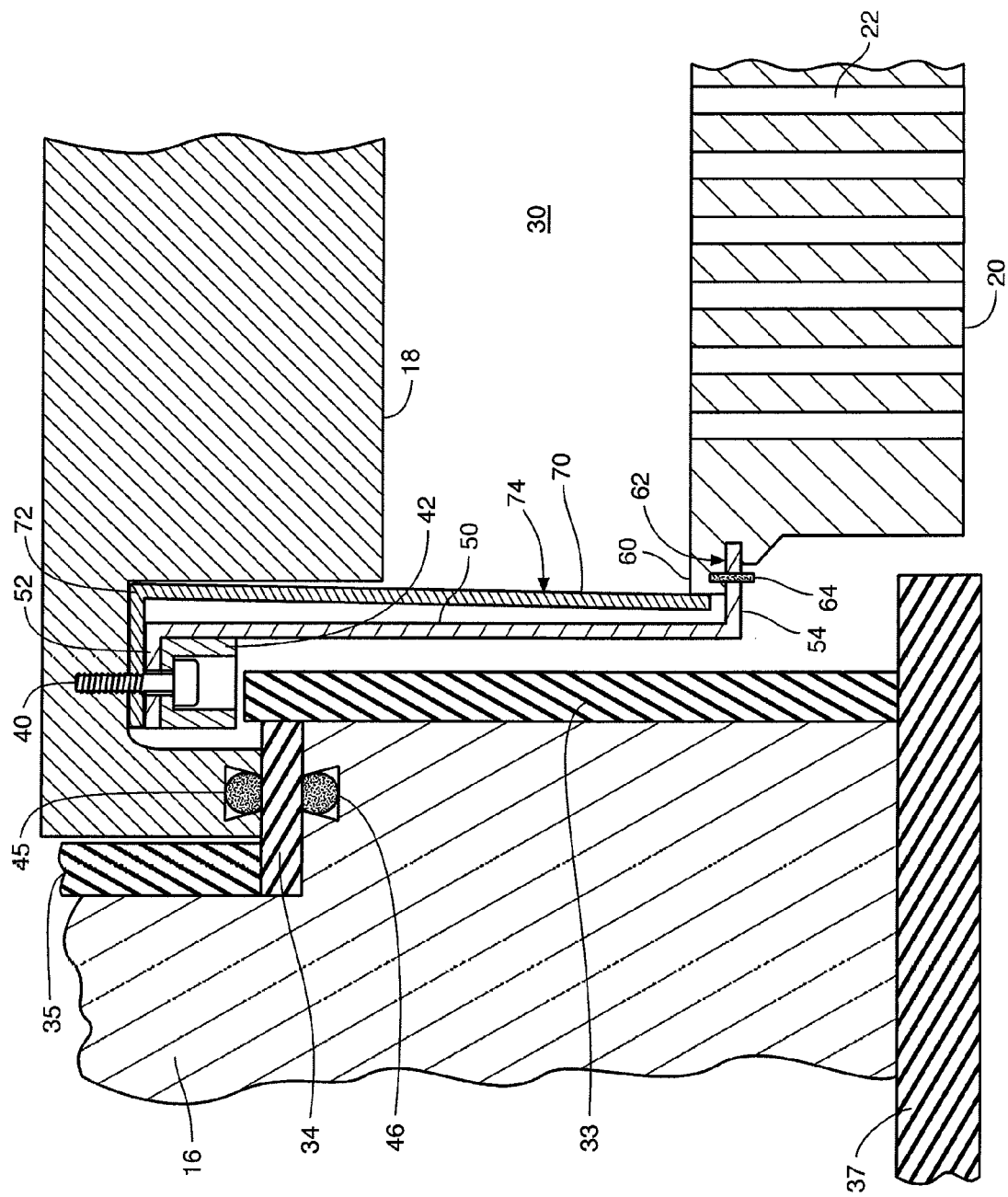
FIGS. 6, 7 and 8 are vertical sectional views of the suspension, showerhead and gas sealing skirt like those of FIG. 2, but showing alternative embodiments of the portion of the showerhead rim adjacent the lower end of the gas sealing skirt.
Figure 7:
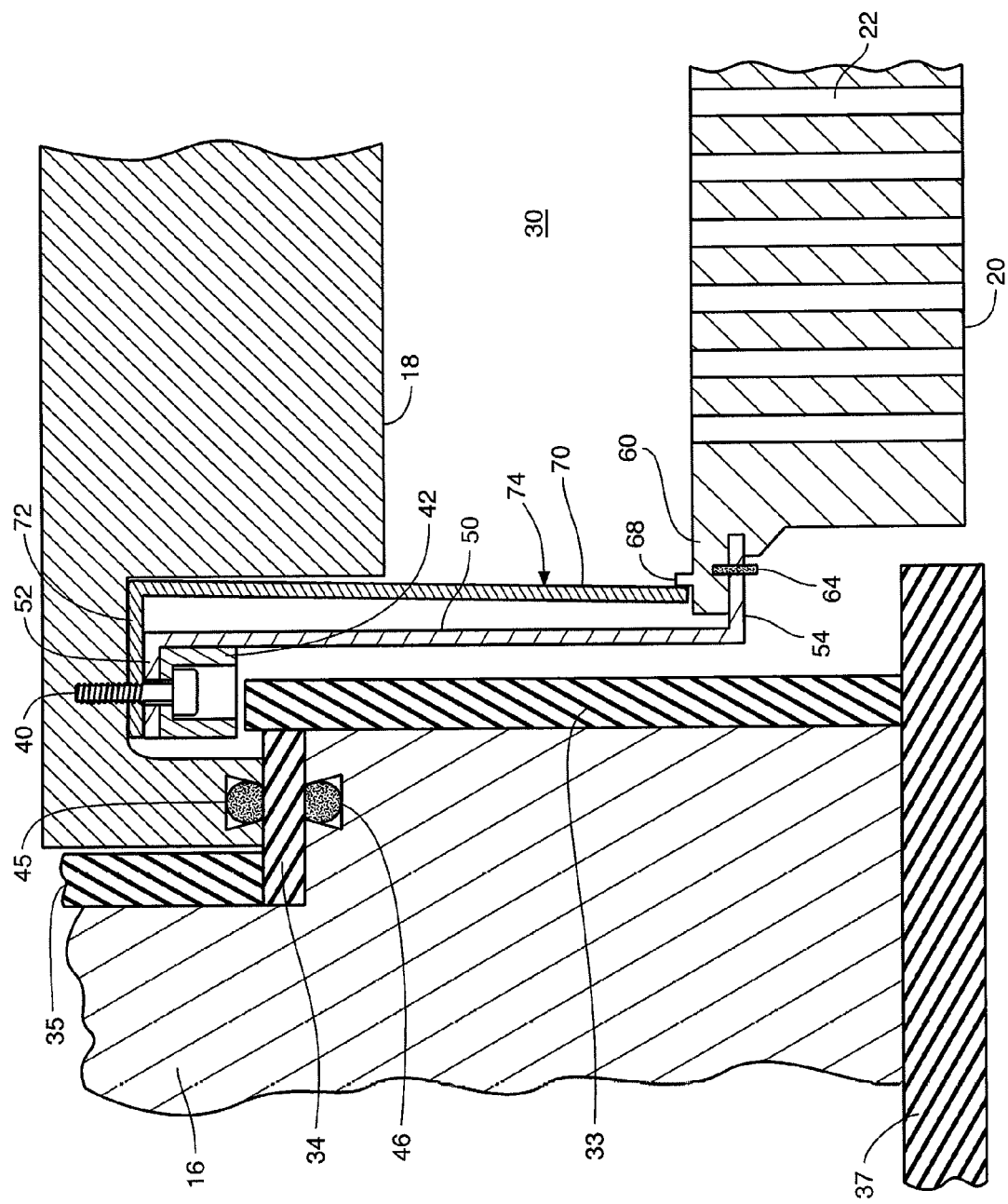
Figure 8:
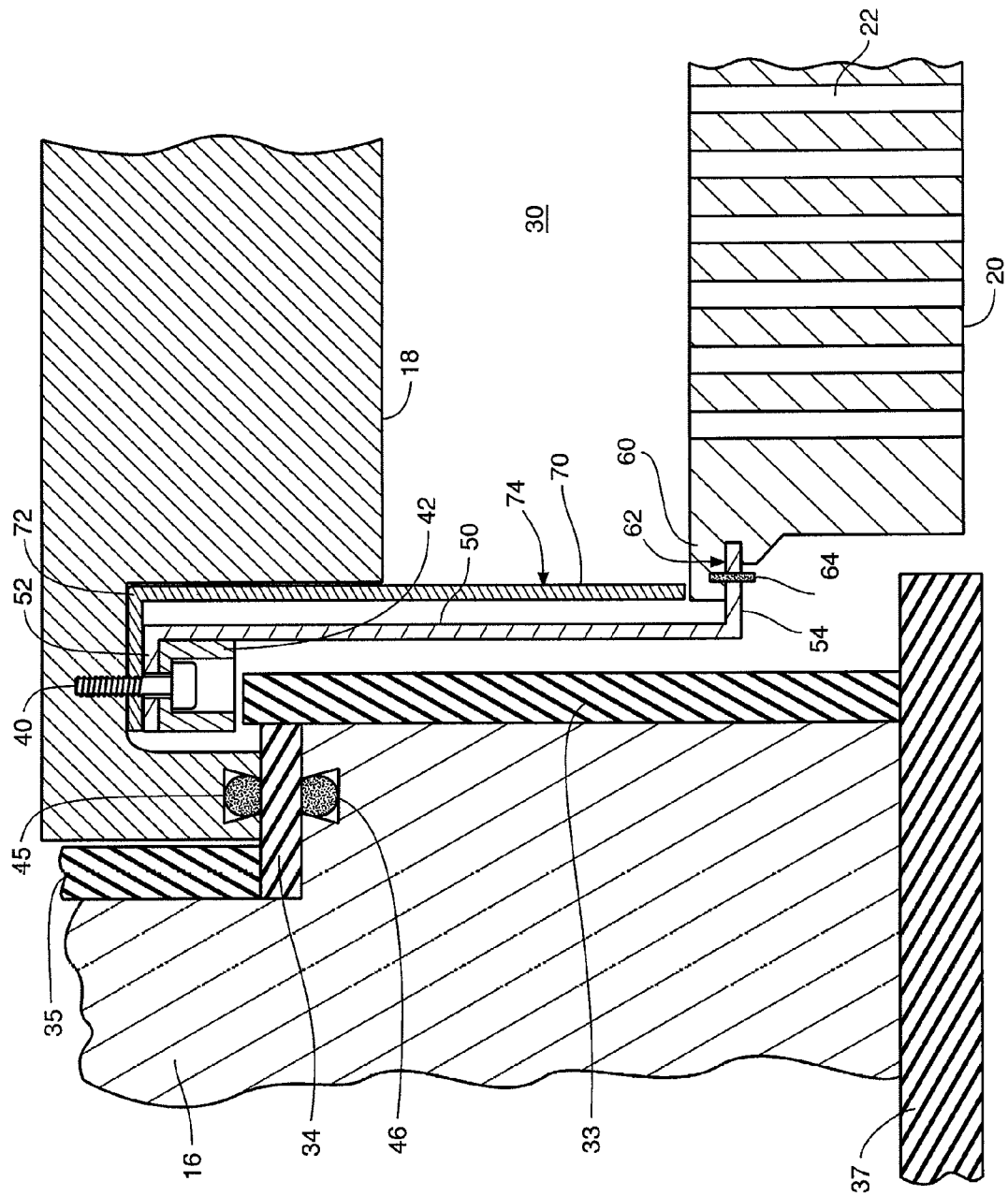

Because the gas sealing skirt 70 is not connected to one of either the chamber wall 14-18 or the showerhead 20, the unconnected upper or lower end of the gas sealing skirt can be separated from said one component by a number of gaps, wherein the number of gaps is greater than or equal to zero. If the number of gaps is zero, that means the unconnected end of the gas sealing skirt abuts said one component, as illustrated by the embodiments of FIGS. 6 and 7 described in detail below. FIG. 8, also described below, illustrates a non-zero gap between the gas sealing skirt and the suspension.

The gas sealing skirt is arranged so that it encircles the sides of a region between the chamber wall and the showerhead such that the chamber wall, the showerhead, the gas sealing skirt and the aforesaid gaps collectively enclose the gas inlet plenum 30, i.e., the volume through which process gas can flow from the gas inlet passageway 26 to the gas outlet passageways 22. (The term "encircle" herein means girdling or surrounding the sides of the aforesaid region without implying a circular shape.)

As stated above, the gas sealing skirt preferably is positioned radially inward of the suspension walls 50 so that the gas sealing skirt is interposed between the gas inlet plenum and the suspension walls 50, i.e., so that the suspension walls 50 are outside the gas inlet plenum 30. The gas sealing skirt 70 will completely block the process gas flowing through the gas inlet plenum 30 from contacting the suspension if the number of gaps is zero as defined in the preceding paragraphs, i.e., if there are no gaps between the unconnected upper or lower end of the gas sealing skirt and the component to which the gas sealing skirt is not connected, where such component is either the chamber wall 14-18 or the showerhead 20 as explained in the preceding paragraphs.

Conversely, if there are such gaps, a fraction of the process gas entering the gas inlet plenum 30 will leak through the gaps and contact the suspension wall 50, thereby undesirably cooling the suspension wall. The fraction of process gas that leaks through the gaps is roughly proportional to the ratio of the combined area of the gaps to the area of the inner surface 74 of the gas sealing skirt, i.e., the surface facing the gas inlet plenum 30, i.e., facing the interior 30 of the gas inlet manifold. In order for the gas sealing skirt to substantially protect the suspension wall from undesirable cooling by the process gas flow, the present invention contemplates that the combined area of the gaps should be no greater than one-third, preferably no greater than one-tenth, the area of the inner surface of the gas sealing skirt.

In the illustrated preferred embodiment in which the gas inlet manifold top wall 18 and the showerhead 20 are rectangular in cross section, the gas sealing skirt 70 preferably comprises four segments respectively connected to the four sides of the gas inlet manifold top wall. Each of the four segments preferably is a rectangular aluminum sheet.

The lower end of each sheet of the gas sealing skirt 70 preferably hangs adjacent to the rim 60 of the showerhead 20 so as to minimize the size of any gaps between the gas sealing skirt and the showerhead. In the preferred embodiment shown in FIG. 2, the top surface of the showerhead rim 60 includes a groove 66 that is close to, and parallel to, the perimeter of the showerhead. The lower end of each sheet of the gas sealing skirt extends into the groove 66, thereby extending below the top surface of the showerhead. When the showerhead expands in response to an elevated temperature, the radially inner wall of groove 66 abuts and pushes outward the lower end of each sheet of the gas sealing skirt 70. Consequently, any gaps between the gas sealing skirt and the showerhead are negligible, thereby forming a good gas seal between the gas sealing skirt and the showerhead.

As explained in the preceding section entitled "2. Flexible Suspension for Showerhead", each sheet of the gas sealing skirt 70 preferably is thin enough to be flexible. In the preferred embodiment, each sheet is 1 mm thick aluminum. Because the gas sealing skirt is flexible, when the showerhead is heated during operation of the chamber and expands radially, the rim of the showerhead can push the abutting lower end of each flexible sheet 70 of the gas sealing skirt radially outward, so that the gas sealing skirt remains in contact with the showerhead. Consequently, any gaps between the gas sealing skirt and the showerhead remain negligible at all temperatures experienced by the gas sealing skirt and the showerhead during operation of the chamber. As stated in the second paragraph of the aforesaid section "2. Flexible Suspension for Showerhead", each side of the aluminum showerhead 20 expands about 0.5% relative to its center at typical operating temperatures of a plasma chamber. Therefore, each sheet of the gas sealing skirt preferably is flexible enough to bend radially outward (i.e., perpendicular to the plane of the sheet) by at least 0.5% of the horizontal width of one side of the gas sealing skirt.

The upper end of each rectangular aluminum sheet of the gas sealing skirt 70 can be bent, preferably at a right angle, to form an upper flange 72 that can be connected to the chamber wall 14-18. That is, upper end of each of the four aluminum sheets functions as an upper flange 72, the remainder of each sheet extending downward from the upper flange functions as the gas sealing skirt 70, and the upper flange 72 connects the gas sealing skirt 70 to the chamber wall 14-18.

Preferably each of the four upper flanges 72 is bolted to the gas inlet manifold top wall 18 using the same bolts 40 that are used to bolt the upper flanges 52 of the four suspension walls 50 to the gas inlet manifold top wall 18. The upper flange 72 of the gas sealing skirt preferably extends radially inward from the bolts a greater distance than the upper flange 52 of the suspension, so that the gas sealing skirt 70 is spaced radially inward from the suspension wall 50. The radial spacing between the gas sealing skirt and the suspension wall should be great enough to prevent them from contacting each other when they undergo thermal expansion and contraction. In the preferred embodiment, this radial spacing is about 5 mm at ambient room temperature.

FIGS. 6, 7 and 8 show alternative designs for the portion of the showerhead rim 60 that is adjacent to or abuts the lower end of the gas sealing skirt 70.

In the embodiment of FIG. 6, each sheet of the gas sealing skirt extends below the top surface of the showerhead so as to abut the radially outer surface of the showerhead rim 60. In this embodiment, each sheet of the gas sealing skirt preferably is connected to the chamber wall at a position such that the upper end of the vertically extending sheet of the gas sealing skirt is somewhat radially inward of the perimeter of the showerhead rim when the showerhead is cool (i.e., at ambient room temperature). That is, the lower end of the gas sealing skirt is deflected outward relative to the upper end so that some tension between the showerhead rim and the lower end of the gas sealing skirt will be maintained at all temperatures, thereby ensuring that any gaps between the gas sealing skirt and the showerhead remain negligible at all temperatures.

In the embodiment of FIG. 7, the lowermost end of the gas sealing skirt is slightly above the top surface of the showerhead 20. The top surface of the showerhead rim 60 includes an upward projecting protuberance or stop 68 whose radially outer surface abuts the radially inner surface of the lower end of each sheet of the gas sealing skirt. The protuberance 68 extends parallel to the perimeter of the showerhead along the entire width of each sheet of the gas sealing skirt so that any gaps between the sheet and the gas sealing skirt are negligible. As in the embodiment of FIG. 6, each sheet of the gas sealing skirt preferably is connected to the chamber wall at a position such that the upper end of the vertically extending sheet of the gas sealing skirt is somewhat radially inward of the outer surface of the protuberance 68 of the showerhead rim when the showerhead is cool.

In the embodiment of FIG. 8, the gas sealing skirt does not abut any portion of the showerhead 20, but the lowermost end of the gas sealing skirt is positioned close to the top surface of the showerhead rim 60. The combined area of the gaps between the lower end of the gas sealing skirt and the showerhead should be no greater than the maximum area specified above.

Although the unconnected end of the gas sealing skirt is the bottom end in the illustrated embodiments, the present invention encompasses an alternative implementation in which the unconnected end of the gas sealing skirt is the top end, and the bottom end of the gas sealing skirt is connected to the showerhead.

5. Openings to Reduce Surface Area of Suspension Wall

To ameliorate or avoid the stresses described above in the section "3. Problem of Suspension Stress During Cooling", a second aspect of the invention comprises providing openings 80 in each suspension wall 50. Such openings reduce the surface area of the suspension wall that is exposed to gas within the process chamber and thereby reduce the transfer of heat between the suspension wall and the gas. Accordingly, when the chamber lid is opened so that cool air at ambient atmospheric pressure rushes into the chamber, the openings reduce the rate of cooling of the suspension wall, thereby reducing stress (thermal shock) within the suspension wall.

To substantially reduce heat transfer between the suspension walls 50 and the gas within the process chamber, the openings 80 within each suspension wall should collectively occupy at least five percent, and preferably at least one-fourth, of the total area of the portion of that suspension wall that is exposed to gas, i.e., the portion that extends vertically between the chamber wall 14-18 and the showerhead 20. The "total area" in the preceding sentence includes both the area of the solid portions of the suspension wall and the area of the openings 80. Alternatively, a less stringent expression of the invention is that the openings 80 within each suspension wall should collectively occupy at least five percent, and preferably at least one-fourth, of the area of that suspension wall. The total area of the openings 80 does not include any area that is occupied or overlain by a bolt or other fastener inserted through any of the openings.

FIG. 9 shows the preferred embodiment in which the openings 80 occupy about two-thirds of the area of vertically extending portion of each suspension wall 50. Each of the four suspension walls are vertically elongated so that each opening 80 extends almost the entire vertical height of the suspension wall. In this preferred embodiment, the lateral spacing between openings is about one-half the width of each opening, so that the openings occupy about two-thirds the area of the vertical portion of each suspension wall.

FIG. 10 shows an alternative embodiment in which the openings 80 extend all the way to the end of the suspension that is not connected to either the chamber wall 14-18 or the showerhead 20. In the illustrated embodiment, the unconnected end of the suspension is the lower flange 54 at the bottom end of each suspension wall 50, so each opening 80 extends radially all the way through the lower flange, so as to form radially extending "fingers" in the lower flange between adjacent openings 80. In this alternative embodiment, the lower end of each finger includes one of the mounting holes 56, 57 that engages a corresponding pin 64 in the showerhead rim, so that the number of openings 80 in each lower flange of the suspension is one less than the number of mounting holes 56, 57.

In comparison with the preferred embodiment of FIG. 9, the alternative embodiment of FIG. 10 has the advantages of: (1) further reducing the stress within each suspension wall when it expands and contracts in the direction of arrow 82, i.e., horizontally in the plane of the suspension wall, and (2) permitting each finger to twist to accommodate differential thermal expansion between the showerhead and the suspension. However, the alternative embodiment of FIG. 10 has two potential disadvantages: (1) in comparison with the FIG. 9 embodiment, it can be more difficult to align the mounting holes 56, 57 in the lower flange 54 with the corresponding pins 64 in the showerhead rim, and (2) the "fingers" of the lower flange are somewhat susceptible to being bent inadvertently by personnel attaching the showerhead to the suspension.

Figure 11:
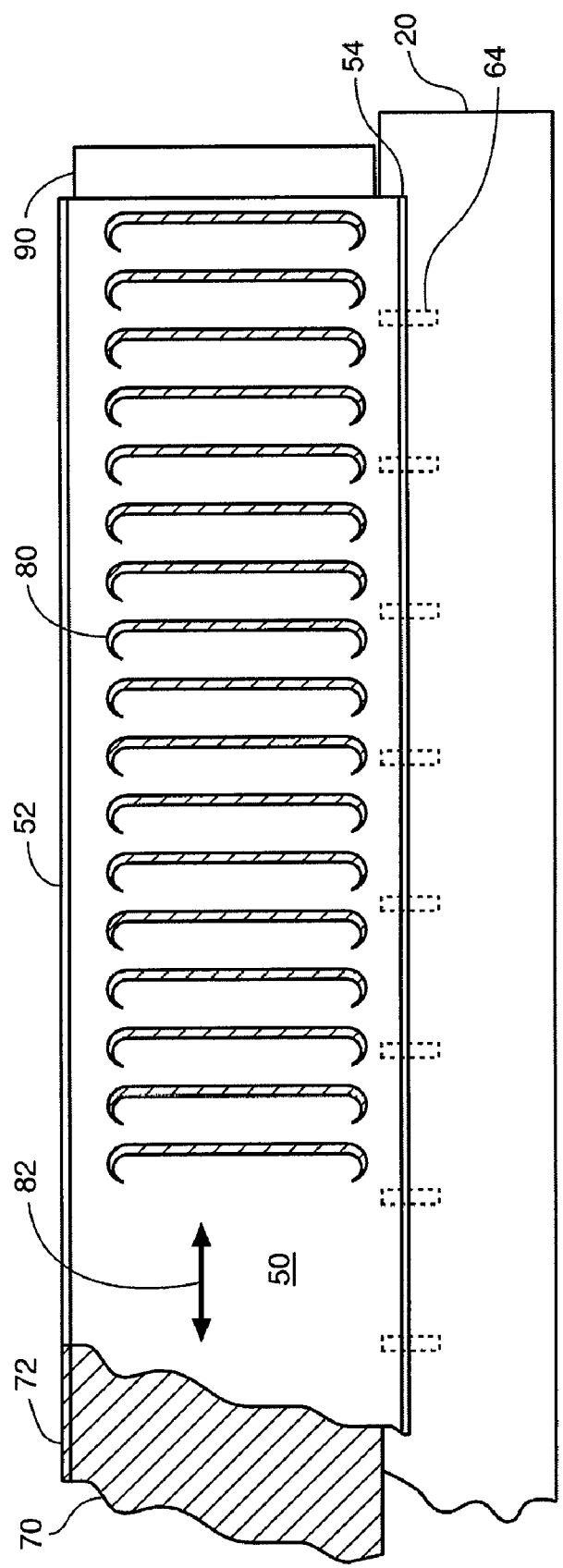
FIG. 11 is a side view of one wall of a second alternative embodiment of the suspension in which each opening is formed by cutting around only part of the circumference of the opening, leaving one edge intact.

FIG. 11 shows a variation of the embodiment of FIG. 9 in which each opening 80 is not completely cut out from the suspension side wall 50, but instead is formed by cutting around only part of the circumference of the opening, leaving one edge intact (the left edge in the illustrated embodiment). The intact edge functions as a hinge allowing the portion 81 of the suspension side wall within the circumference of the opening to be pushed outward so as to form the opening.

6. Vertical Arrangement of One or More Rifts

To ameliorate the thermally induced stresses in the suspension walls described in the above section "3. Problem of Suspension Stress During Cooling", a third aspect of the invention comprises providing at least one substantially vertical arrangement of one or more rifts in each suspension wall 50. The rifts can ameliorate stress in a suspension wall by weakening the wall at the location of the rifts, thereby facilitating horizontal flexing or buckling of the wall in response to thermal stress. Such flexing or buckling can relieve the stress so as to reduce the risk that recurring stress eventually will deform, crack or tear the wall.

A rift can be formed in a suspension wall by any means, such as cutting, piercing or stamping. Furthermore, a rift can be any shape and need not extend entirely through the suspension wall. For example, a rift can be a slit, perforation or opening of any shape that extends entirely through the suspension wall. Such a rift can be formed by, for example, cutting or piercing the suspension wall so as to form an incision without removing any material from the wall, or it can be formed by removing material from the wall so as to create an opening. Alternatively, a rift can be a groove or notch that does not extend entirely through the suspension wall. However, a rift does not include an opening that is occupied by a bolt or other fastener that rigidly attaches the suspension wall to another object because such a fastener would prevent the opening from performing the function of facilitating flexing or buckling of the suspension wall.

A substantially vertical arrangement of one or more rifts can be either a single rift that is substantially vertically elongated (FIG. 12), or else a plurality of rifts of any shape that are spaced apart in a substantially vertical direction (FIG. 13). FIG. 12 illustrates a suspension wall 50 having plurality of vertically elongated rifts 84, where each vertically elongated rift 84 consists of a vertically oriented slit formed so that no material of the suspension wall is removed. FIG. 13 illustrates a suspension wall 50 having plurality of vertically elongated rifts 84, where each vertically elongated rift 84 consists of a vertically spaced plurality of circular openings 86.

For the purposes of this patent specification and claims, "substantially vertical" means within 45 degrees of vertical. In the case of a plurality of rifts of any shape that are spaced apart in a substantially vertical direction, the plurality of rifts need not be colinear; it suffices for the plurality of rifts to lie within a elongated area that is oriented within 45 degrees of vertical.

Arranging the one or more rifts in each suspension wall substantially vertically rather than horizontally is important to achieve the best stress reduction. Specifically, a substantially vertical arrangement of rifts in a suspension wall facilitates flexing or buckling of the suspension wall in the horizontal direction in the plane of the suspension wall (the direction of arrow 82), thereby relieving horizontal components of stress. Stress within a suspension wall in the vertical direction typically can be relieved by the suspension wall bowing inward or outward. However, without a substantially vertical arrangement of rifts according to the invention, stress in the horizontal direction typically cannot readily be relieved because the upper portion (such as upper flange 52 in FIG. 3) of each suspension wall typically is rigidly bolted to the chamber wall 14-18 at multiple points along its width, and the lower portion (such as lower flange 54 in FIG. 3) of each suspension wall typically is rigidly connected to the rim 60 of the showerhead 20, or else its horizontal expansion is constrained by the width of elongated mounting holes 57.

7. Coplanar Suspension Walls

To ameliorate the thermally induced stresses in the suspension walls described in the above section "3. Problem of Suspension Stress During Cooling", a fourth aspect of the invention comprises replacing at least one of the suspension walls 50 with a plurality of coplanar suspension walls 50 as shown in FIG. 14.

More precisely, the suspension walls 50 described herein as coplanar actually are coplanar only in their respective central portions. Each such suspension wall has a central portion between an upper portion and a lower portion, where the upper portion is connected to the chamber wall 14-18 and the lower portion is connected to the showerhead 20. The upper and lower portions may include flanges 52, 54 that are not coplanar. However, at least two of the suspension walls have central portions that are coplanar. Preferably, the coplanar central portions of two suspension walls are horizontally separated by vertical gaps 88.

If the number of coplanar suspension walls is represented by the variable N, then each coplanar wall will have a width reduced approximately by a factor of N in comparison with the width of the single suspension wall it replaces. The width of each coplanar wall will be reduced by an even greater factor if the gaps 88 between the coplanar walls have a width that is at least a substantial fraction of the width of each coplanar wall.

Figure 14:
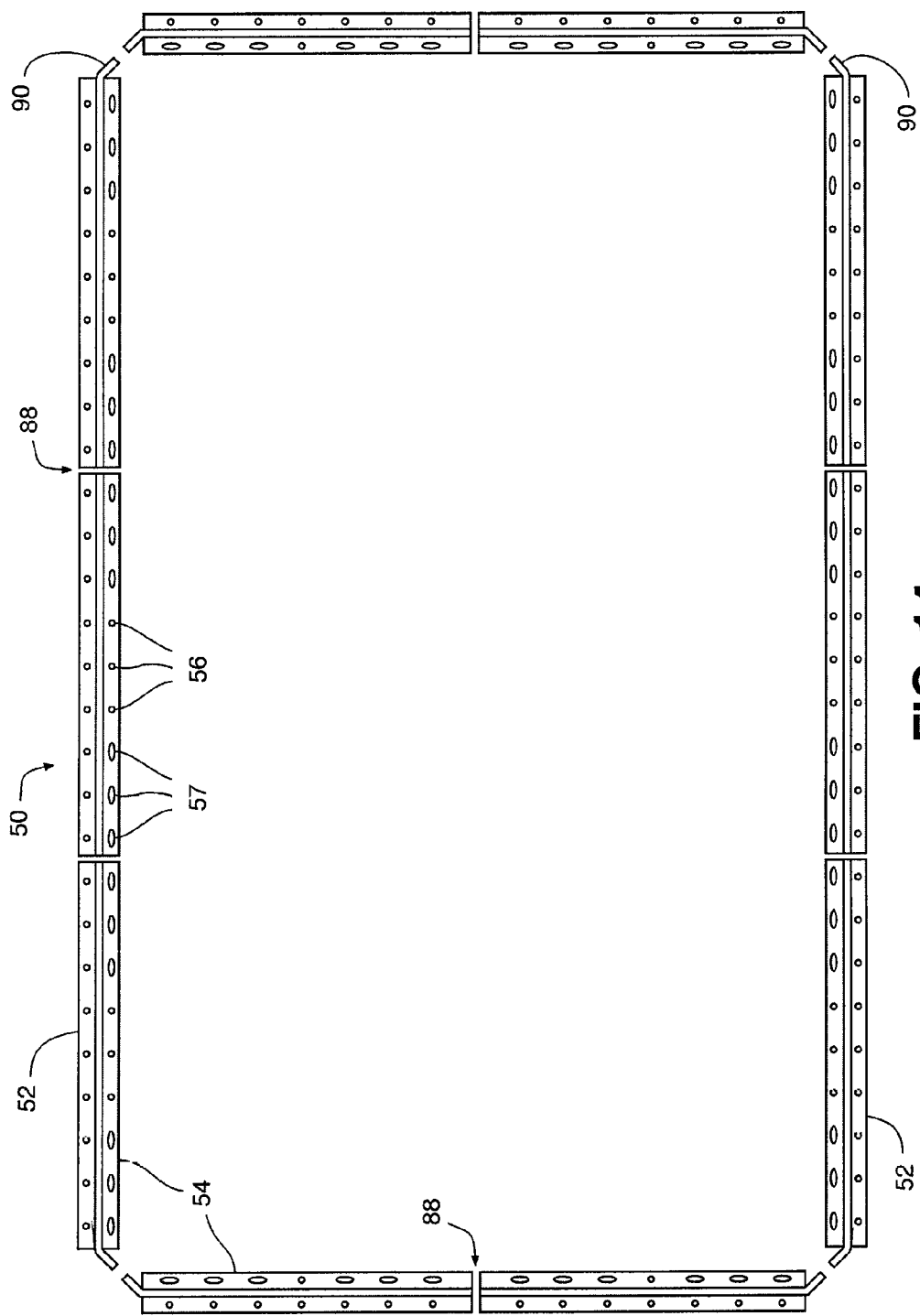
FIG. 14 is a plan view of a suspension comprising a plurality of coplanar suspension walls separated by vertical gaps in accordance with a fourth aspect of the invention.

Comparing the embodiment of the invention shown in FIG. 14 with the prior art design shown in FIG. 3, the two long suspension walls 50 in FIG. 3 are replaced in the FIG. 14 design by three walls (N=3) of roughly one-third the width. The two short suspension walls in FIG. 3 are replaced in FIG. 14 by two walls (N=2) of roughly one-half the width.

Reducing the width of a suspension wall correspondingly reduces the horizontal component of any thermally induced stress in the suspension wall. Therefore, the invention should reduce the risk that the suspension walls eventually will suffer deformation, cracks or tears in response to such stress.

When the showerhead 20 is rectangular as shown in FIG. 14, the suspension walls connected to a given one of the four lateral sides of the showerhead should be coplanar, while the suspension walls respectively connected to two adjacent sides of the showerhead should be perpendicular.

The invention claimed is:

1. Process chamber apparatus comprising:
a showerhead having a plurality of gas outlet passageways;
a suspension comprising one or more suspension side walls, wherein each suspension side wall includes (i) an upper portion, (ii) a lower portion connected to the showerhead so that the suspension suspends the showerhead below the upper portion, and (iii) a flexible portion extending vertically between the upper portion and the lower portion;
a gas inlet passageway; and
a gas inlet manifold side wall between the gas inlet passageway and the suspension, wherein the gas inlet manifold side wall provides substantial impedance to gas leakage from the gas inlet passageway to the suspension;
wherein the suspension includes a plurality of elongated holes such that:
  (i) each hole has a longest dimension oriented substantially vertically,
  (ii) the holes are spaced apart horizontally, and
  (iii) the flexible portion of each suspension side wall includes one or more of said holes.

2. The apparatus of claim 1, wherein each hole comprises:
a substantially vertically oriented slit in the flexible portion of one of the suspension side walls.

3. The apparatus of claim 1, wherein each hole comprises:
a substantially vertically oriented elongated opening that extends entirely through the flexible portion of one of the suspension side walls.

4. The apparatus of claim 1, wherein each hole comprises:
a substantially vertically oriented elongated groove in the flexible portion of one of the suspension side walls.

5. The apparatus of claim 1, wherein:
the suspension and the showerhead are a unitary piece of material.

6. The apparatus of claim 1, wherein:
each hole has a vertical dimension greater than its dimension in any horizontal direction.

7. The apparatus of claim 1, further comprising:
a chamber wall that includes a chamber top wall and a chamber side wall, wherein the chamber wall includes one or more one gas inlet passageways;
wherein the upper portion of each suspension side wall is connected to the chamber wall.

8. Process chamber apparatus comprising:
a showerhead having a plurality of gas outlet passageways;
a suspension comprising one or more suspension side walls, wherein each suspension side wall includes (i) an upper portion, (ii) a lower portion connected to the showerhead so that the suspension suspends the showerhead below the upper portion, and (iii) a flexible portion extending vertically between the upper portion and the lower portion;
a gas inlet passageway; and
a gas inlet manifold side wall between the gas inlet passageway and the suspension, wherein the gas inlet manifold side wall provides substantial impedance to gas leakage from the gas inlet passageway to the suspension;
wherein the suspension includes a plurality of groups of holes such that:
  (i) each hole includes a substantially vertically spaced plurality of holes,
  (ii) the groups are spaced apart horizontally, and
  (iii) the flexible portion of each suspension side wall includes one or more of said groups.

9. The apparatus of claim 8, wherein each group comprises:
a substantially vertically spaced plurality of perforations in the flexible portion of one of the suspension side walls.

10. The apparatus of claim 8, wherein each group comprises:
a substantially vertically spaced plurality of openings extending entirely through the flexible portion of one of the suspension side walls.

11. The apparatus of claim 8, wherein each group comprises:
a substantially vertically spaced plurality of notches in the flexible portion of one of the suspension side walls.

12. The apparatus of claim 8, wherein:
the suspension and the showerhead are a unitary piece of material.

13. The apparatus of claim 8, further comprising:
a chamber wall that includes a chamber top wall and a chamber side wall, wherein the chamber wall includes one or more one gas inlet passageways;
wherein the upper portion of each suspension side wall is connected to the chamber wall.

14. The apparatus of claim 8, wherein:
for each group, the plurality of holes within that group collectively lie within an elongated area that is oriented within 45 degrees of vertical.

15. The method of claim 14, wherein each group comprises:
a substantially vertically spaced plurality of perforations in the flexible portion of one of the suspension side walls.

16. The method of claim 14, wherein each group comprises:
a substantially vertically spaced plurality of openings extending entirely through the flexible portion of one of the suspension side walls.

17. The method of claim 14, wherein each group comprises:
a substantially vertically spaced plurality of notches in the flexible portion of one of the suspension side walls.

18. A method of suspending a showerhead in a process chamber, comprising the steps of:
providing a showerhead having a plurality of gas outlet passageways;
providing a suspension comprising one or more suspension side walls, wherein each suspension side wall includes (i) an upper portion, (ii) a lower portion, and (iii) a flexible portion extending vertically between the upper portion and the lower portion;
connecting the lower portion of each suspension side wall to the showerhead so that the suspension suspends the showerhead below the upper portion of that suspension side wall;
providing a gas inlet passageway; and
providing a gas inlet manifold side wall between the gas inlet passageway and the suspension, wherein the gas inlet manifold side wall provides substantial impedance to gas leakage from the gas inlet passageway to the suspension;
wherein the step of providing the suspension further comprises forming in the suspension a plurality of elongated holes such that:
  (i) each hole has a longest dimension oriented substantially vertically,
  (ii) the holes are spaced apart horizontally, and
  (iii) the flexible portion of each suspension side wall includes one or more of said holes.

19. The method of claim 18, wherein each hole comprises: a substantially vertically oriented slit in the flexible portion of one of the suspension side walls.

20. The method of claim 18, wherein each hole comprises: a substantially vertically oriented elongated opening that extends entirely through the flexible portion of one of the suspension side walls.

21. The method of claim 18, wherein each hole comprises: a substantially vertically oriented elongated groove in the flexible portion of one of the suspension side walls.

22. The method of claim 18, wherein:
the suspension and the showerhead are a unitary piece of material.

23. The method of claim 18, wherein:
each hole has a vertical dimension greater than its dimension in any horizontal direction.

24. The method of claim 18, further comprising the steps of:
providing a chamber wall comprising a chamber top wall and a chamber side wall, wherein the chamber wall includes one or more one gas inlet passageways; and
connecting the upper portion of each suspension side wall to the chamber wall.

25. A method of suspending a showerhead in a process chamber, comprising the steps of:
providing a showerhead having a plurality of gas outlet passageways;
providing a suspension comprising one or more suspension side walls, wherein each suspension side wall includes (i) an upper portion, (ii) a lower portion, and (iii) a flexible portion extending vertically between the upper portion and the lower portion;
connecting the lower portion of each suspension side wall to the showerhead so that the suspension suspends the showerhead below the upper portion of that suspension side wall;
providing a gas inlet passageway; and
providing a gas inlet manifold side wall between the gas inlet passageway and the suspension, wherein the gas inlet manifold side wall provides substantial impedance to gas leakage from the gas inlet passageway to the suspension;
wherein the step of providing the suspension further comprises forming in the suspension a plurality of groups of holes such that:
(i) each group includes a substantially vertically spaced plurality of holes,
(ii) the groups are spaced apart horizontally, and
(iii) the flexible portion of each suspension side wall includes one or more of said groups.

26. The method of claim 25, wherein:
the suspension and the showerhead are a unitary piece of material.

27. The method of claim 25, further comprising the steps of:
providing a chamber wall comprising a chamber top wall and a chamber side wall, wherein the chamber wall includes one or more one gas inlet passageways; and
connecting the upper portion of each suspension side wall to the chamber wall.

28. The apparatus of claim 25, wherein:
for each group, the plurality of holes within that group collectively lie within an elongated area that is oriented within 45 degrees of vertical.

\* \* \* \* \*